United States Patent
Tzuang et al.

[11] Patent Number: 5,930,696
[45] Date of Patent: Jul. 27, 1999

[54] BROADBAND LOW-NOISE LOW-INTERMODULATION RECEIVER

[75] Inventors: Ching-Kuang Tzuang, Department of Communications Engineering, National Chiao Tung University, 1001 Ta Hsueh Road, Hsinchu; Chen-Hwa Lin, No. 20, Nung An Street, Taipei; Tsan-Hsi Lin, 8F, No. 115, Min-Sheng Road, Hsinchu, all of Taiwan

[73] Assignees: Ching-Kuang Tzuang; Chen-Hwa Lin; Tsan-Hsi Lin, all of, Taiwan

[21] Appl. No.: 08/900,297

[22] Filed: Jul. 25, 1997

[30] Foreign Application Priority Data

Feb. 18, 1997 [TW] Taiwan ................................ 86101864

[51] Int. Cl.$^6$ .............................. H04B 1/10; H04B 1/18; H04B 1/06; H04N 5/44
[52] U.S. Cl. ...................... 455/311; 455/188.2; 455/260; 348/725
[58] Field of Search .......................... 455/3.2, 130, 150.1, 455/168.1, 176.1, 187.1, 188.1–188.2, 189.1, 190.1, 192.1, 192.2, 232.1, 234.1, 245.1, 296, 260, 264, 311, 313–315; 348/725, 726, 729, 731, 733, 735, 737

[56] References Cited

U.S. PATENT DOCUMENTS

| | | | |
|---|---|---|---|
| 4,379,271 | 4/1983 | Lehmann | 455/188.2 |
| 4,397,037 | 8/1983 | Theriault | 455/311 |
| 4,520,507 | 5/1985 | Moon | 455/315 |
| 4,850,038 | 7/1989 | Shibata et al. | 455/311 |
| 5,752,175 | 5/1998 | Roullet et al. | 455/264 |

*Primary Examiner*—Curtis A. Kuntz
*Assistant Examiner*—George Eng
*Attorney, Agent, or Firm*—Pillsbury Madison & Sutro LLP

[57] ABSTRACT

An RF receiver apparatus that is suitable for implementation as a monolithic IC core with minimum external components is disclosed. The receiver apparatus features low noise figure, low intermodulation and almost fixed input impedance over a broad frequency band covering cable TV, broadcast TV, direct broadcast satellite TV. Other outstanding features includes 40 dB dynamic gain controllable range and minimum electromagnetic radiation due to fully differential signal design. Above all, due to the highly integrated design of the invention, it is suitable for miniaturized tuner appliation.

11 Claims, 25 Drawing Sheets

BROADBAND LOW-NOISE LOW-INTERMODULATION RECEIVER

BACKGROUND OF THE INVENTION

1. Field of the Invention

This invention relates in general to a receiver, and in particular to a receiver for receiving broadcast signals. More particularly, the invention relates to a receiver implementable as a small monolithic device capable of receiving radio frequency broadcast signals in a wide frequency range, less susceptible to noise interference, and features low intermodulation distortion as well as low radiated electromagnetic energy.

2. Technical Background

As high-frequency radio communication technology advances, there has been an increasing demand for high-quality broadband receivers for the reception of RF (radio frequency) broadcasts such as tuners for TV broadcasts. Traditional TV tuners, however, have been unable to cope with the requirements of modem high-quality video and audio standards. On the other hand, new generations of miniature receivers incorporated into personal computer systems that are light and small, such as those receiver devices for use in the notebook computer environments have been developed. However, these devices were constructed using discrete components, their physical sizes were too excessive to be incorporated into the portable computers. As a result, monolithic IC implementations of these devices were developed.

Thus, IC-based receivers have emerged, of which one is depicted in FIG. 1A. FIG. 1A shows the circuit diagram of a conventional IC-based circuit design for a typical TV/VCR receiver. The receiver circuitry included a UHF input filter 20, a VHF input filter 21, two low-noise RF amplifiers 22 and 23, two inter-stage filters 24 and 25, a GaAs tuner IC 26, an UHF resonator 27, a VHF/CATV resonator 29, an IF (intermediate frequency) filter 28, and a prescalar 30. This typical TV/VCR receiver employed two different input filters 20 and 21 for filtering the input signals at the UHF and VHF/CATV categories respectively whose outputs were then fetched to their corresponding differential low-noise amplifiers 22 and 23 for amplification. Adjusted respectively under the corresponding frequency band controlling signals Bu and Bv, amplifiers 22 and 23 amplified their respective UHF and VHF inputs and then sent the amplified signals to the corresponding inter-stage filters 24 and 25 for tracking-filtering. Outputs of filters 24 and 25 were then fed to the tuner IC 26 for subsequent processing.

FIG. 1B details the block diagram of an implementation of the tuner IC 26 employed in the receiver of FIG. 1A. As is illustrated, the tuner IC was consisted essentially of a frequency band switch 261, a UHF oscillator 262, a VHF/CATV oscillator 263, an oscillator buffer 264, a double-balanced mixer 265, and an intermediate frequency amplifier 266. Two categories of signals input to the GaAs tuner IC 26, either VHF or UHF, were selected at the frequency band switch 261 by the proper application of the Bu and Bv controlling signals. Further, the Bu and Bv control signals also controlled the switching of the corresponding resonators external to the IC unit. Frequency locking was achieved by the oscillator buffer outputting to the prescalar 30 (FIG. 1A) in combination with a phase-locked loop controller not shown in the drawing. When the properly-switched output RF signal was input to the mixer 265 together with the local oscillator signal output by the buffer 264, an output is produced by the mixer 265 that was filtered at the IF filter 28 external to the IC device and then fed back to the internal IF amplifier 266. A UN gain control signal Bm was used to control the amplification gain provided by this amplifier.

Though the receiver of FIG. 1A was built around an IC core circuitry, circuit electrical characteristics, however, was less than ideal. In particular, the noise figure of the receiver of FIG. 1A was found to be greater than 8 dB, which required the use of additional circuitry constructed out of discrete circuit elements external to the IC tuner core for improvements. Use of the noise improvement circuitry, however, introduced further disadvantageous effects over the reception characteristics of the receiver at the high UHF bands.

FIG. 2A schematically outlines the use of a conventional IC tuner used in a satellite TV receiver at the frequency range of 950 MHz to 2 GHz. The entire receiver system was built around an IC tuner 40 that constituted the core circuitry of the receiver. In addition to the tuner IC 40, together with a couple of coupling capacitors $C_A$ and $C_B$, only a resonator 41 was used to construct the receiver system. This was quite a simple receiver circuitry.

As can be seen in the drawing, the IC tuner 40 was made up of an RF amplifier (RFAMP), a mixer (MIX), an oscillator (OSC), and an IF amplifier (IFAMP). In practice, there should be an IF filter connected to the IF output terminal of the IC tuner when operated.

The IC tuner device used in the system of FIG. 2A was one that was fabricated in an enhanced mode gallium arsenide metal semiconductor field-effect transistor (GaAs MESFET) process, which was different from the conventional depletion mode process. Further, the system depicted in FIG. 2A was most characterized by the fact that a multivibrator oscillator such as the one illustrated in the schematic diagram of FIG. 2B was used. When coupled with the proper resonator (resonator 41 in FIG. 2A), negative impedance could be obtained within a wide frequency range, which was a good characteristics for wide frequency range oscillators. In addition, since the output was differential, it could therefore be directly coupled to the double-balanced mixer for input thereto.

Though very simple in construction, however, the receiver system of FIG. 2A suffer a noise figure of greater than 10 dB. What's more, such receiver was only capable of operation in the satellite TV frequency range. General cable or broadcast TV operations were not applicable. Usefulness of such receiver systems was therefore greatly restrained.

FIG. 3 illustrates a conventional integrated tuner system suitable for use in the cable TV environment. This was a system employing a configuration of two frequency conversions. A GaAs frequency-up converter IC circuitry 50 was used to up-convert the frequency of the input RF signal with a frequency of about 50 to 550 MHz. The input RF signal was fed to a low-noise automatic gain-control amplifier 501 governed by the automatic gain control signal AGC. Output of the AGC amplifier 501 was then mixed at the mixer 502 with an oscillator signal generated by the oscillator 503 having output frequency thereof controlled by a tuning signal TUNING. Mixed output of the up converter 50 was then fetched to an IF filter 51. This allowed to pick up the up-converted IF signal of, for example, 700 MHz frequency in the output of the IF filter 51. Output of filter 51 was then mixed at another mixer 52 with another oscillator signal generated by another oscillator 53. Modulation at this node resulted in the picking up of a down-converted signal of, for example, 45 MHz. After processing in the circuitry system of FIG. 3, the system was considered to be generally acceptable for use in the CATV frequency range of about 50 to 550 Mhz only.

More, due to the fact that linear region of transistors was employed to perform the automatic gain control, the controlled range of the gain was limited. This was disadvantageous considering the amplification distortion for large RF signals as well as the uniformity of IF output signal intensity. Further, since two frequency conversions were employed while only one circuitry for implementing the conversion was implemented inside the IC device, more additional discrete circuit components must therefore be used to implement the second of the two conversions. As a result, system simplification gradually became impossible.

As such, conventional receivers were still with many of the disadvantageous problems. First of all, receiver operating frequency range must be increased so that applications thereof can be expanded. Then, to fulfill the requirements of modern high-quality tuners, receiver electronic characteristics such as low noise figure, good amplifier linearity, low intermodulation, as well as low phase noise in the oscillator should be secured. Moreover, in order to be suitable for mobility applications, a receiver must be implemented into monolithic IC devices with least external components. Finally, simple and mature IC fabrication process must be used to fabricate such IC devices in order to reduce costs.

SUMMARY OF THE INVENTION

It is therefore an object of the present invention to provide receiver apparatus that can be implemented in IC devices and covering a broad frequency bands including the frequency ranges of cable TV, broadcast TV, and direct broadcast satellite TV and higher.

It is another object of the present invention to provide a receiver apparatus that can be implemented in IC devices and having low noise characteristics.

It is still another object of the present invention to provide a receiver apparatus that can be implemented in IC devices and having low intermodulation characteristics.

It is yet another object of the present invention to provide a receiver apparatus that can be implemented in IC devices and having substantially fixed input impedance.

It is yet another object of the present invention to provide a receiver apparatus that can be implemented in IC devices and having low interference noise and radiation noise.

It is yet another object of the present invention to provide a receiver apparatus that can be implemented in IC devices and requiring little external components when used for constructing receiver systems.

The present invention achieves the above-identified objects by providing low-noise low-intermodulation broadband receiver that has a low-noise amplifier to receive an input differential or single-ended RF signal for amplification. The low-noise amplifier has low noise figure, low distortion, input impedance matching and differential output signal. A first buffer is used to receive the output of the low-noise amplifier, adjust DC biasing, generate buffered signal and prevent reverse signal flow. A first voltage/current converter receives the first buffered output signal, and linearly coverts the voltage signal into a current signal. An automatic gain control amplifier receives the current signal generated by the first voltage/current converter and converts it into voltage signal for output, and adjusts the amplification gain based on the gain control signal input by an IF output amplitude sensor, for maintaining the output thereof at a designated amplitude level. A second buffer receives the output signal of the automatic gain control amplifier, adjusts DC biasing, generates buffered signal and prevents reverse signal flow. A tracking filter receives the output signal of the second buffer and allows passage therefrom only the component of the RF signal with designated frequency and filters out all other signal components. A second voltage/current converter receives the RF signal output by the tracking filter and has designated frequency, and converts the voltage signal into a current signal. A phase-locked loop has a voltage-controlled oscillator core, a resonator, a third buffer and a phase-locked loop controller, wherein the resonator receives the control signal of the phase-locked loop controller to determine an oscillation frequency, the voltage-controlled oscillator core is connected to the resonator for generating an oscillation signal having the designated frequency, and the oscillation signal is buffered by the third buffer and input to the phase-locked loop controller, the third buffer receives the output signal of the voltage-controlled oscillator core, adjusts DC biasing, generates buffered signal and prevents reverse signal flow, and the phase-locked loop controller receives channel data and generates band switching signal and frequency fine-tuning signal for the tracking filter. A mixer receives the signal of the second voltage/current converter and the signal buffered by the third buffer for generating the mixed signal of the two signals. A fourth buffer receives the output signal of the mixer, adjusts DC biasing, generates buffered signal and prevents reverse signal flow. An IF filter receives the buffer output of the fourth buffer for generating a final IF signal for subsequent signal demodulation. In addition, to minimize the interferences from the unwanted channels, a pre-selection filter can be inserted before the input end of the first low noise amplifier if needed. This filter receives the differential or single-ended RF input signal to pre-select the necessary nearby channels and shift the input impedance to the desired level.

BRIEF DESCRIPTION OF THE DRAWING

Other objects, features, and advantages of the present invention will become apparent by way of the following detailed description of the preferred but non-limiting embodiments. The description is made with reference to the accompanied drawings in which:

FIG. 5A or FIG. 5B are applied to a multi-channel system;

DETAILED DESCRIPTION OF THE PREFERRED EMBODIMENT

Figure 1A:
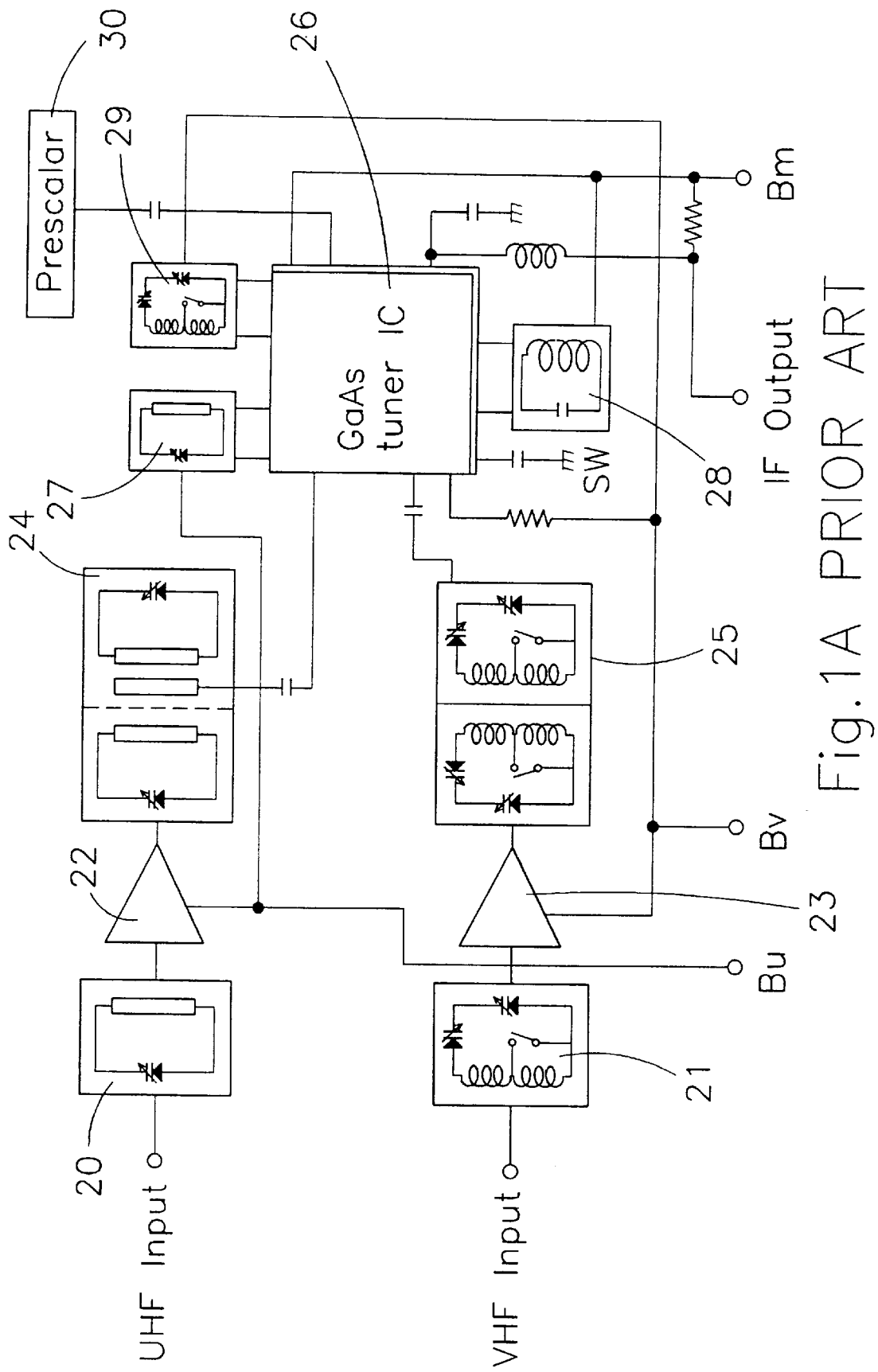
FIG. 1A shows the circuit diagram of a conventional IC-based circuit design for a typical TV/VCR receiver.
Figure 1B:
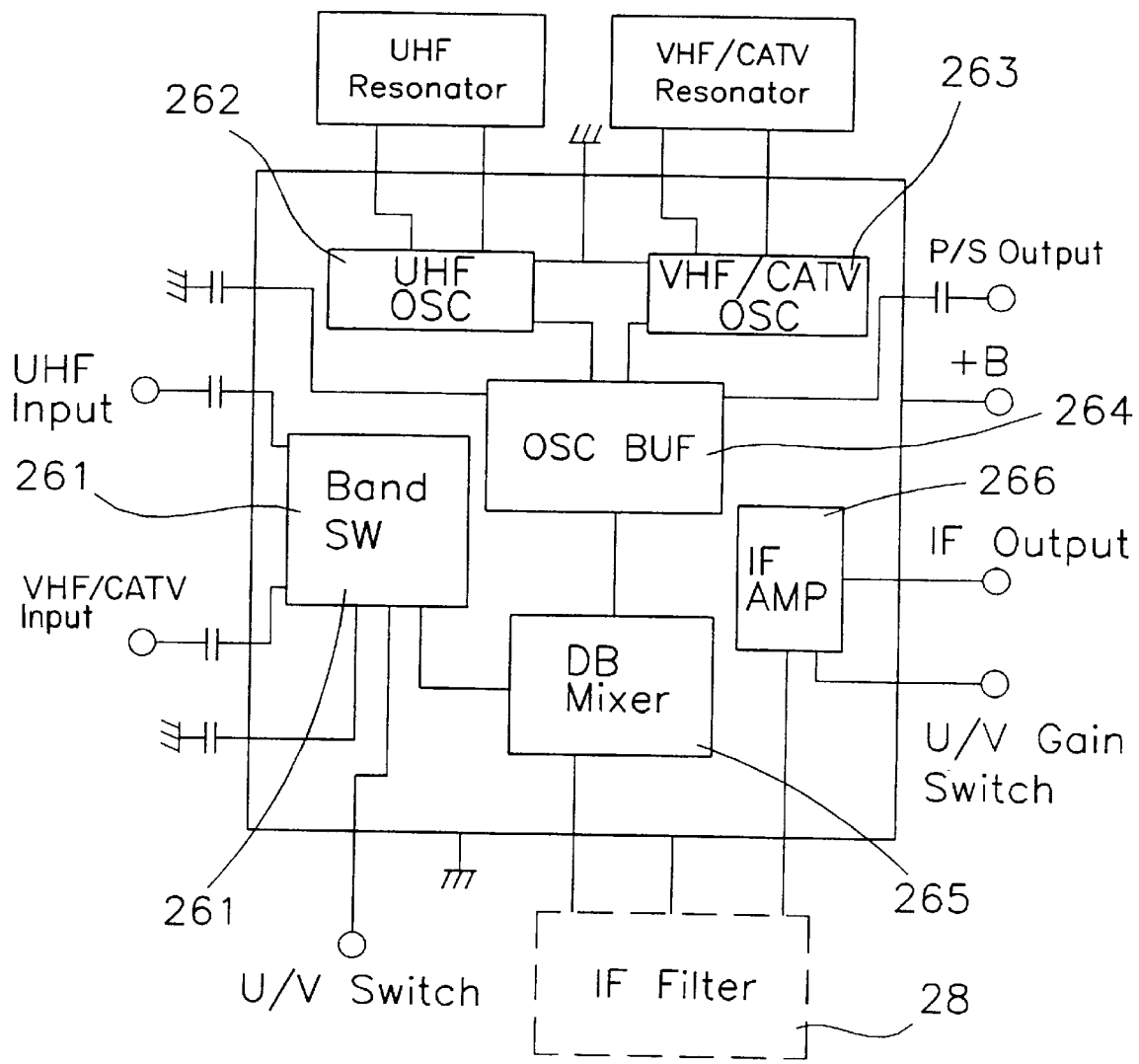
FIG. 1B shows the block diagram of the tuner IC employed as the core circuitry in the receiver of FIG. 1A.
Figure 2A:
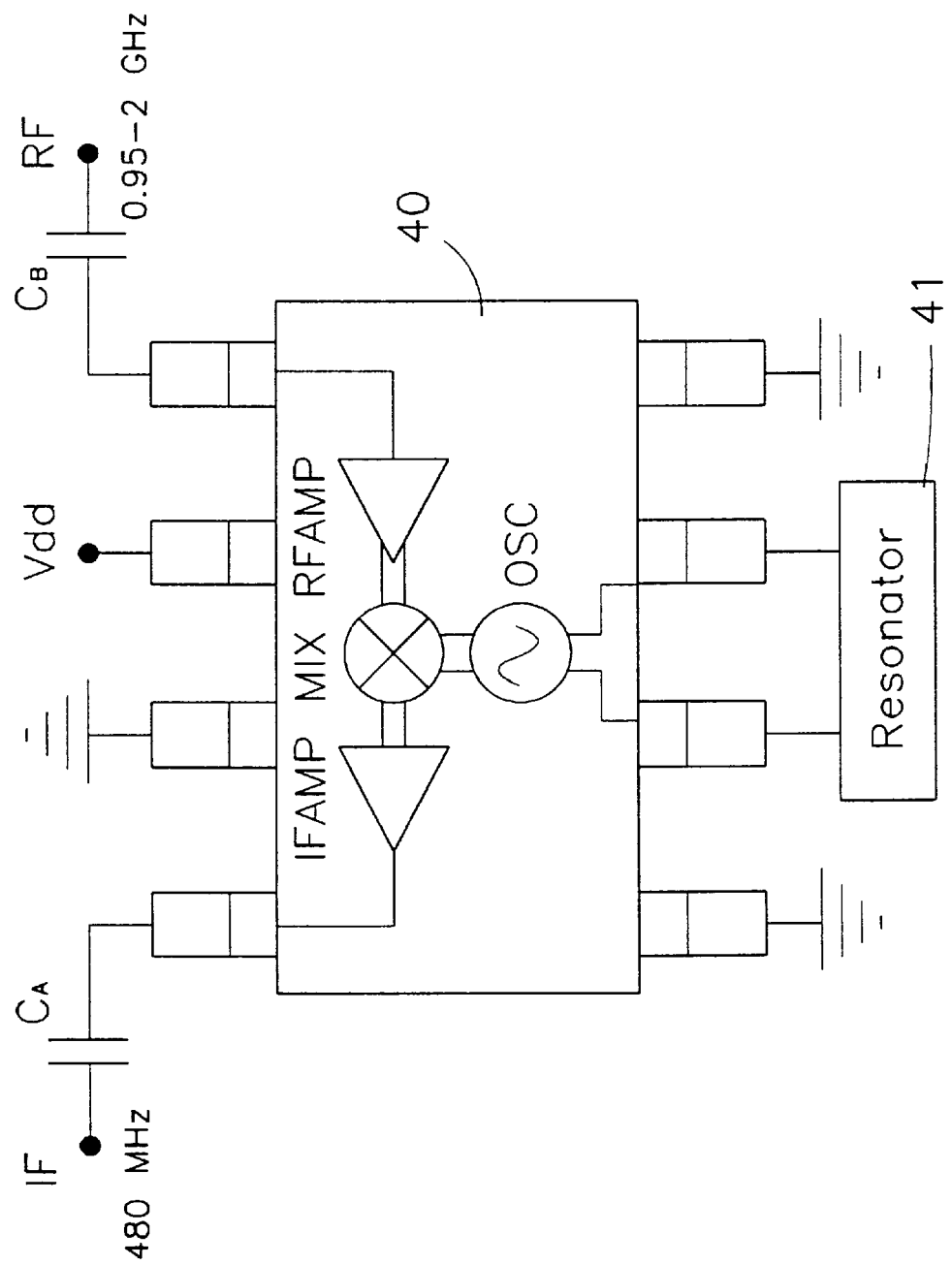
FIG. 2A schematically outlines the use of a conventional IC tuner used in a satellite TV receiver.
Figure 2B:
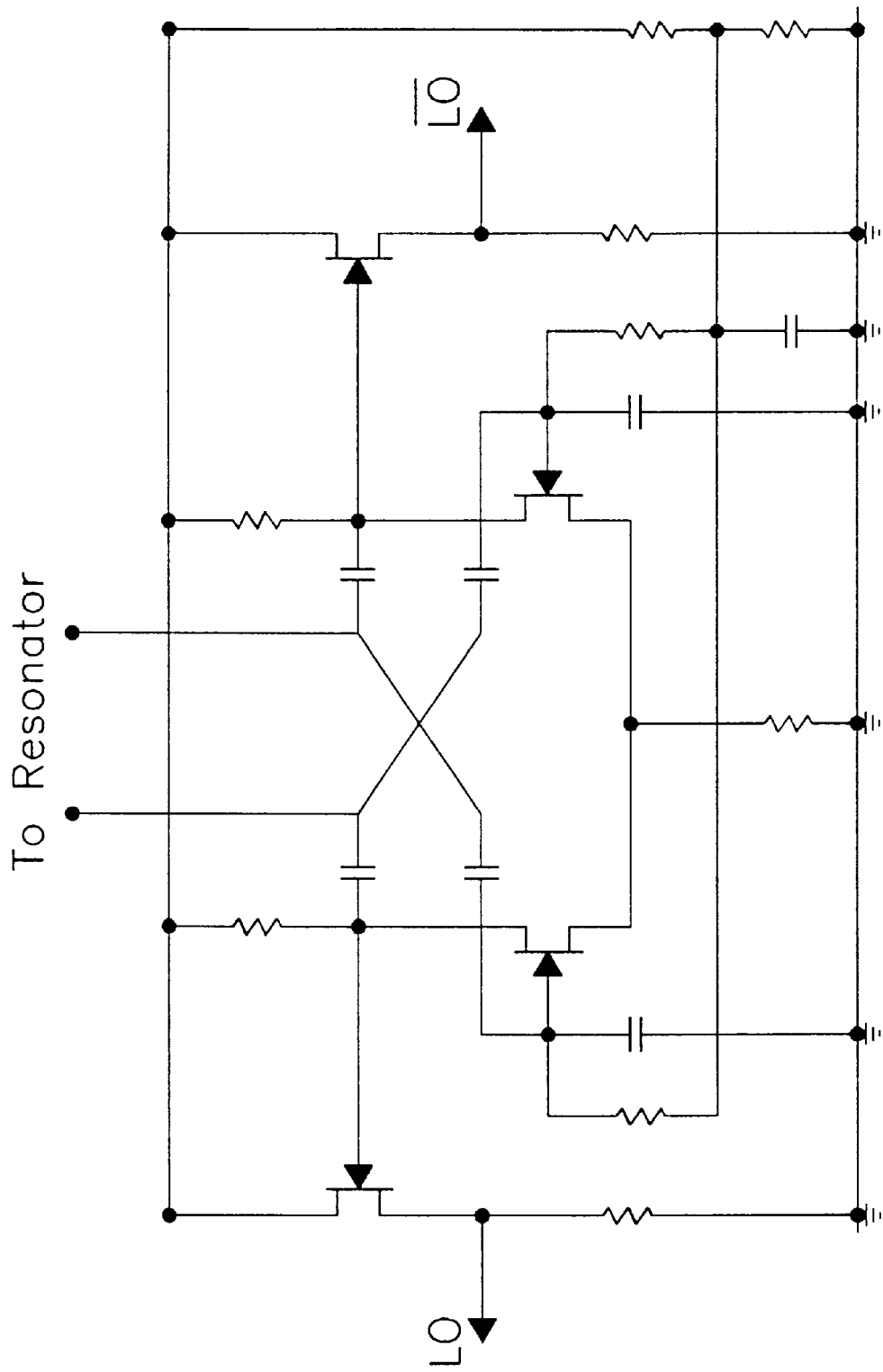
FIG. 2B shows the multi-vibrator oscillator used in FIG. 2A.
Figure 3:
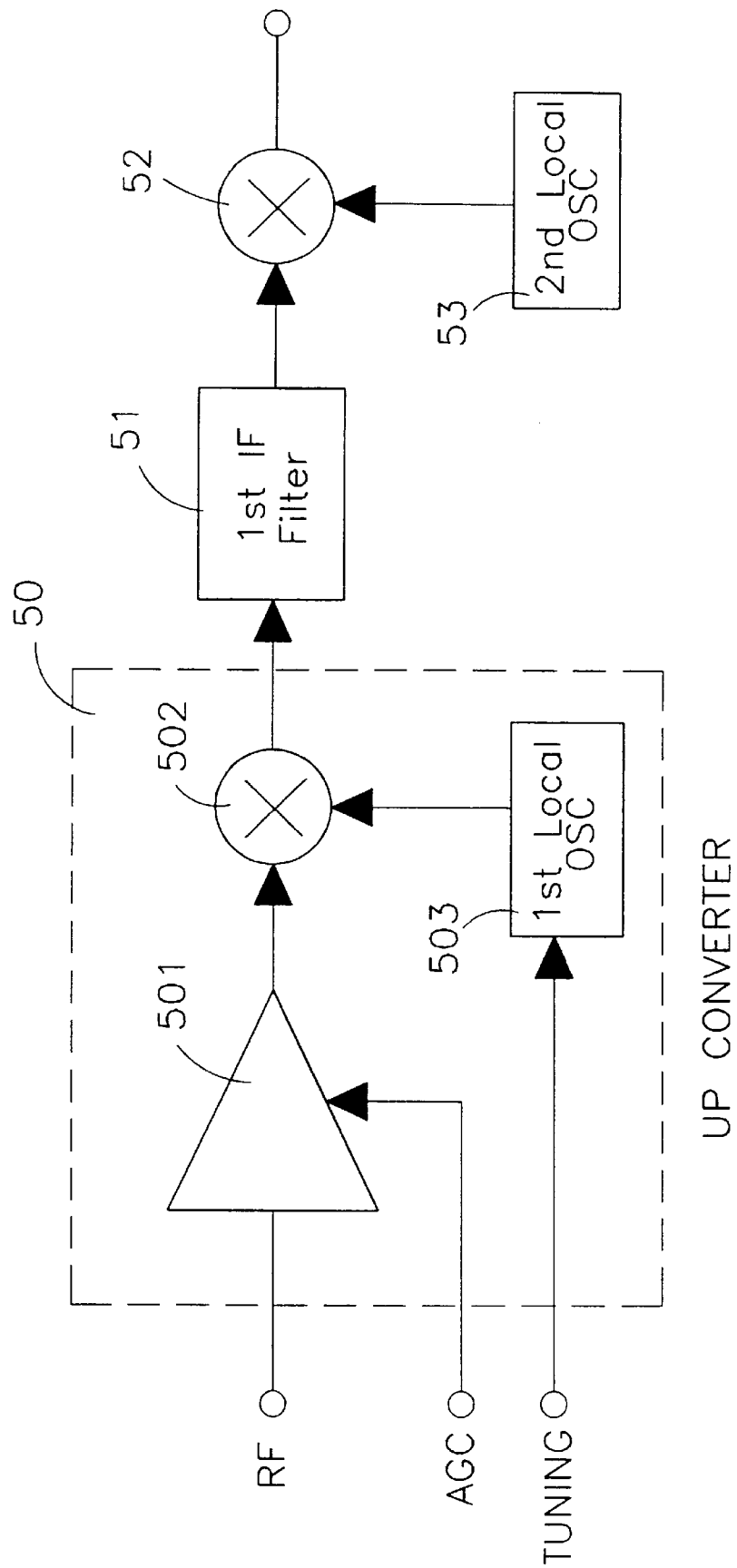
FIG. 3 illustrates a conventional integrated tuner system suitable for use in the cable TV environment.
Figure 4A:
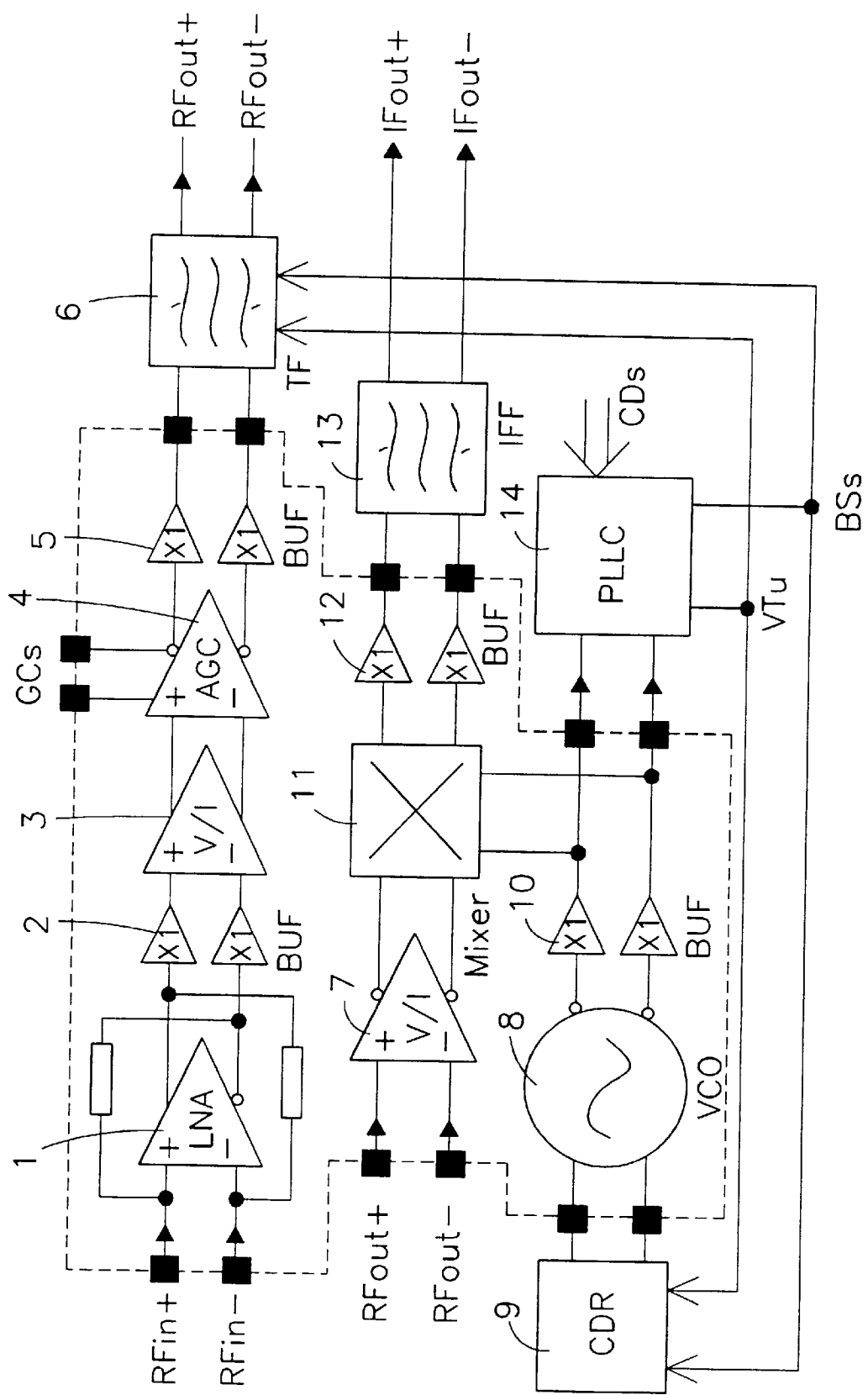
FIG. 4A is a block diagram of a receiver having low noise and low intermodulation in accordance with a preferred embodiment of the invention.

FIG. 4A is a block diagram of a receiver having low noise and low intermodulation in accordance with a preferred embodiment of the invention. As is illustrated in the drawing, the inventive system includes a differential low-noise low-distortion broadband amplifier 1 (LNA), four DC-coupled buffers 2, 5, 10 and 12 (BUF), two voltage/current linear converters 3 and 7 (V/I), a differential low-distortion automatic gain control amplifier 4 (AGC), a tracking filter 6 (TF), a differential voltage-controlled oscillator core 8 (VCOC), a configurable differential resonator 9 (CDR), a low-distortion double-balanced mixer 11 (MIX), an IF filter 13 (IFF), and a phase-locked loop controller 14 (PLLC). In the drawing, the components enclosed in the phantom-lined box can be implemented within a single IC device.

Figure 4B:
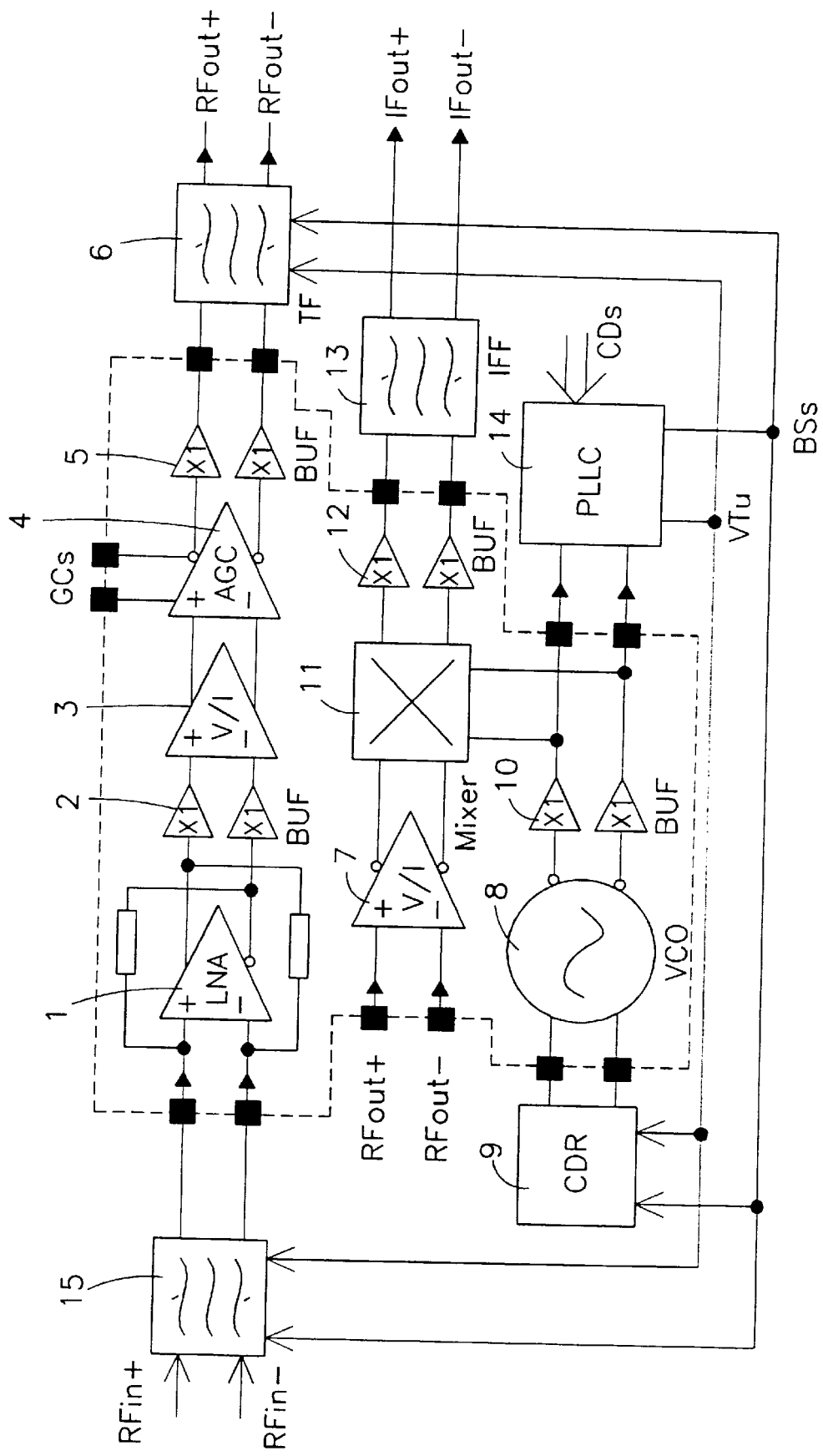
FIG. 4B is a modified version of FIG. 4A with a pre-selection filter inserted before the input end of FIG. 4A.

On the other hand, FIG. 4B is a schematic diagram showing the receiver of another embodiment of the invention. The receiver of FIG. 4B is one that is simply based on the system of FIG. 4A, but with an additional pre-selection filter attached to the RF input terminal thereof.

The receiver of the invention has a broad operating frequency range in the RF band, ranging from 40 MHz to over 3 GHz. Input for the receiver can be received with an antenna or relayed through a coaxial cable from a cable TV network. The input signal can be either single-ended or differential signal.

In the receiver of FIG. 4B, the input RF signal, either differential-fed or single-ended (RFin− input terminal tied to ground in this case), is processed in advance in the pre-selection filter 15 before being processed in the receiver circuitry. The pre-selection filter 15 can be a band-pass filter that has its center frequency controlled by a pair of control signals VTu and BSs. This is done by adjusting the fine-tuning signal VTu and the band switching signal BSs issued by the phase-locked loop controller 14. Proper control of the filtering characteristics of the pre-selection filter 15 via control of the signals VTu and BSs allows to pass RF input signals with designated frequency. In other words, signals with unwanted frequency can thus be filtered, minimizing interference from other channels other than the desired one. Thus, the filtered output of the pre-selection filter 15 is then sent to the input of the low-noise amplifier 1 in the receiver system of FIG. 4B. In comparison, the RF input signal is directly input to the low-noise amplifier 1 of the system illustrated in FIG. 4A.

The low-noise amplifier 1 in the receiver system of FIGS. 4A and 4B is used to amplify the input RF signal (either pre-filtered by a pre-selection filter or not) featuring matched input impedance and generates differential output. The low-noise and low-distortion differential output of the amplifier 1 is then input to the DC-coupled buffer 2, which provides adequate DC biasing adjustment and buffering for the signal. The buffered output of the DC-coupled buffer 2 is then sent to the voltage/current linear converter 3 in a balanced manner via a pair of coupling signal lines. The converter 3 transforms the large voltage signal which may cause serious amplification distortion into relatively small current signal. Then, the differential automatic gain control amplifier 4 transforms the current signal to voltage output of designated level with minimum distortion. In addition, the amplifier 4 provides its amplification for the current signal under automatic gain control based on the gain control signal GCs fed by an IF output amplitude sensor not shown in the drawing. The gain control signal GCs allows to uniformly maintain the output of the amplifier 4 at substantially constant amplitude regardless of the amplitude of its input signal.

Output of the automatic gain control amplifier 4 is then buffered by another DC-coupled buffer 5 before being sent to the tracking filter 6. The tracking filter 6 serves to allow the passing of the RF signal component having the designated frequency. All other undesired signal components are filtered. The tracking filter 6 achieves this selective (or, tracking) filtering under control of the pair of control signals including the fine-tuning signal VTu and the band switching signal BSs as generated by the phase-locked loop controller 14. Output of the tracking filter 6, namely signals RFout+ and RFout−, may then become the input to the low-distortion double-balanced mixer 11 after being converted in the voltage/current linear converter 7.

Another set of input signals for the mixer 11 is obtained from the buffered output of the voltage-controlled oscillator core 8. This same set of signals is also input to the phase-locked loop controller 14 for implementing the phase locking. Resonator 9, on the other hand, provides as the resonator for the voltage-controlled oscillator core 8. A channel data signal CDs provided by an external interface circuitry is input to the phase-locked loop controller 14 in order to generate the corresponding frequency fine-tuning signal VTu, which can be used to adjust for obtaining the adequate resonating capacitance of a varactor internal to the resonator 9. Meanwhile, voltage-controlled oscillator core 8, resonator 9, buffer 10 and phase-locked loop controller 14 may be used in combination to provide precision locking of the oscillating output at the oscillator 8.

In addition, in order to expand the oscillation frequency range of the voltage-controlled oscillator core 8, resonator 9 is designed into a configurable type of differential resonator. The resonator 9 receives the band switching signal BSs generated by the phase-locked loop controller 14 for controlling to obtain different resonating inductance, so as to switch between different frequency bands. Further, the phase-locked loop controller 14 employs the signal VTu as the control signal for the tracking filter 6. The frequency fine-tuning signal VTu adjusts the varactor capacitance in the tracking filter 6 in cooperation with the inductance switching caused by the control signal Bs in the corresponding frequency bands so as to implement the tracking filtering functionality. The frequency selection characteristics of the tracking filter 6 can in fact improve the system noise figure and intermodulation.

Together, voltage/current linear converter 7 and double-balanced mixer 11 in the receiver system of FIGS. 4A and 4B constitute a low-intermodulation mixer, wherein the converter 7 receives the output signal (a voltage signal) of the tracking filter 6 having a relatively large amplitude and converts it into a current signal having a relatively smaller amplitude. The transformed current signal from converter 7 is then mixed in the mixer 11 with another set of signals generated by the voltage-controlled oscillator core 8 buffered at the DC-coupled buffer 10. The mixed signal is buffered at the DC-coupled buffer 12 for output via the IF filter 13, which filters the desired differential IF signals IFout+ and IFout−. With the aids of the voltage/current linear converters 3 and 7, and due to the fact that the differential amplifier 1, the DC-coupled buffers 2 and 5, as well as the differential automatic gain control amplifier 4 used to feed the double-balanced mixer 11 are all with low distortion, the intermodulation in the mixer 11 can be maintained at the lowest possible level.

Figure 5A:
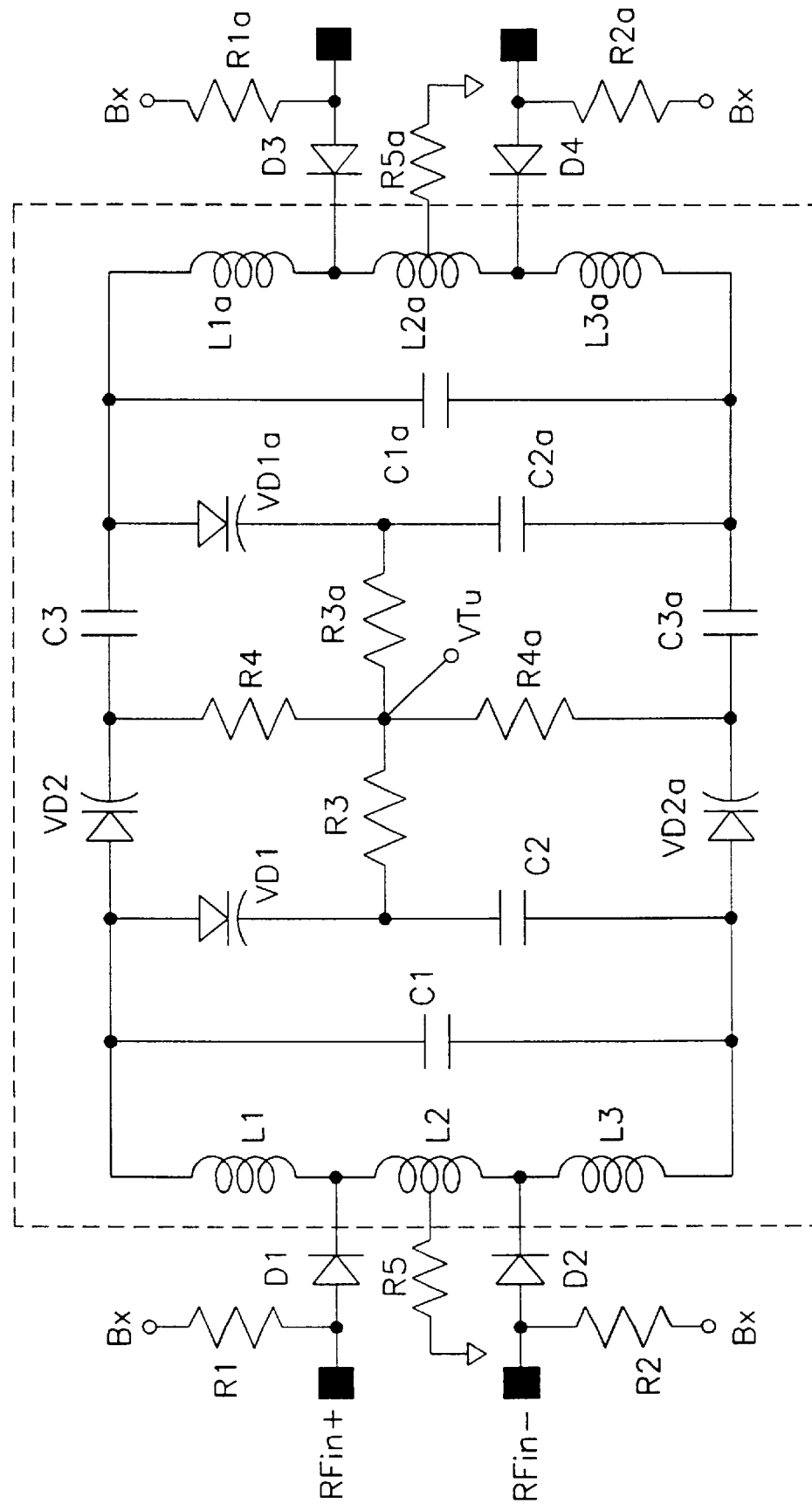
FIG. 5A is a schematic diagram of a preferred embodiment of the band-pass filter used as the pre-selection filter for the receiver of FIG. 4B that receives differential RF input signals.
Figure 5B:
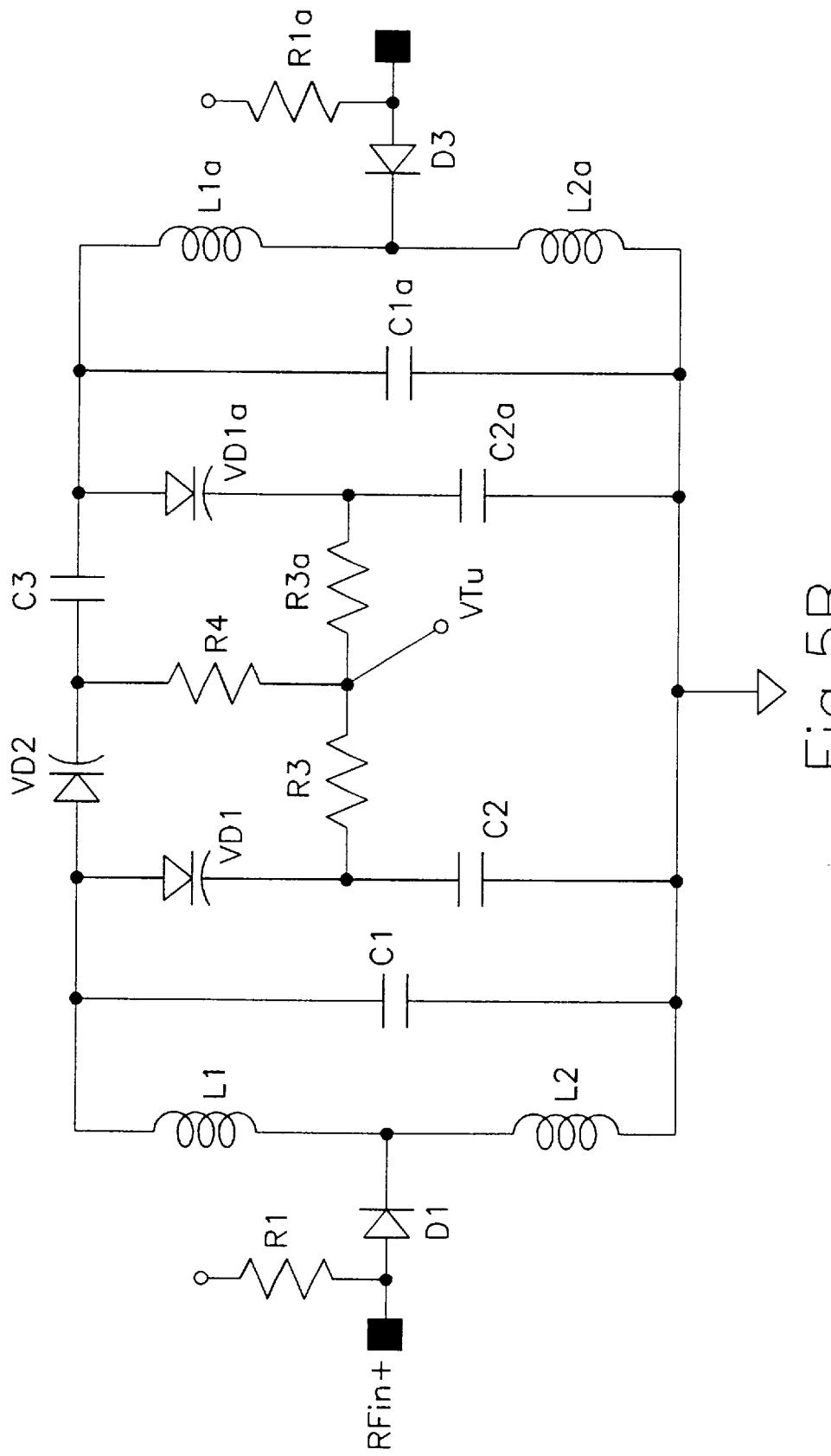
FIG. 5B is a schematic diagram of a preferred embodiment of the band-pass filter used as the pre-selection filter for the receiver of FIG. 4B that receives single-ended RF input signals.

As the input RF signal for a receiver contains signal components of the entire frequency range, a pre-selection filter 15 such as that installed in the receiver of FIG. 4B can be used to remove all the interference to the desired channel of signal as much as possible. Effectively, the low-noise filter 15, which is a band-pass filter, can be used to allow the passage into the amplifier 1 of the receiver only the signals with the desired frequency range. Such pre-selection filters are therefore helpful in improving the overall reception performance of the receiver system. FIGS. 5A and 5B depicts a couple of the preferred embodiments of these input filters, in which FIG. 5A shows the schematic diagram of the input filter for receiving differential input RF signals, while FIG. 5B shows that for the single-ended inputs.

As is illustrated in FIG. 5A, the depicted input band-pass filter that may be used as the pre-selection filter for the receiver of FIG. 4B for receiving differential RF inputs is enclosed in the phantom-lined box. Switching diodes D1 and D2 controlled by band switching signal Bx are used to facilitate the input control of differential RF signals RFin+ and RFin− into the filter. Differential RF signals are admitted into the double-resonance filter only when the control signal Bx applied at the terminals of the resistors R1 and R2 is at its high value.

The double-resonance filter, as is illustrated, is consisted of two sets of resonator circuitries. The first resonator circuit is a parallel connection of a series connection of three inductors L1, L2 and L3, one capacitor C1, and another series connection of a varactor VD1 and a capacitor C2. The second resonator circuit, in a similar configuration, is a parallel connection of a series connection of three inductors L1a, L2a and L3a, one capacitor C1a, and another series connection of one varactor VD1a and a capacitor C2a. The two resonator circuits are coupled together by a gridwork of resistors R3, R3a, R4 and R4a, capacitors C3 and C3a, and varactors VD2 and VD2a.

In the first resonator circuitry, L1, L2 and L3 constitute the resonator inductor network each having a corresponding equivalent inductance for different frequency bands of the input RF signal. Inductors L1, L2 and L3 also provide the impedance conversion functionality, with the inductor L2 center-tapped to connect to system ground potential via a large-resistance resistor R5. This provides a DC bias circuit path for switching diodes D1 and D2 at the input end of the filter itself. The series and parallel connection of the capacitors C1 and C2 and the varactor VD1 constitute the capacitor section of the resonator circuit whose equivalent capacitance can be altered via application of the fine-tuning signal VTu. Essentially, the application of the controlling signal VTu effectively changes the equivalent capacitance of the varactor VD1, thereby altering the equivalent capacitance of the capacitor network. In a similar manner, the equivalent capacitance of the capacitor network in the second resonator circuitry can be fine-tuned, i.e., via altering the effective capacitance in the varactor VD1a. Further, the varactors VD2 and VD2a are also tuned as the fine-tuning control signal VTu is applied in the coupling grid work. Changes in the effective capacitance of the varactors VD2 and VD2a further alters the coupling characteristics between the two resonator circuitries. Consequently, together with the control of the switch signal Bx, adjustment in the control signal VTu can directly result in the shift of the filter center frequency. Similar in the case of the switching diodes D1 and D2 at the filter input end, another pair of switching diodes D3 and D4 at the filter output end may be used to govern the filter output to the next connected circuitry stage.

The band-pass filter for single-ended RF signals as outlined in FIG. 5B has a similar circuit configuration as that described in FIG. 5A and, therefore, operations details in the circuit level would not be elaborated herein.

Figure 5C:
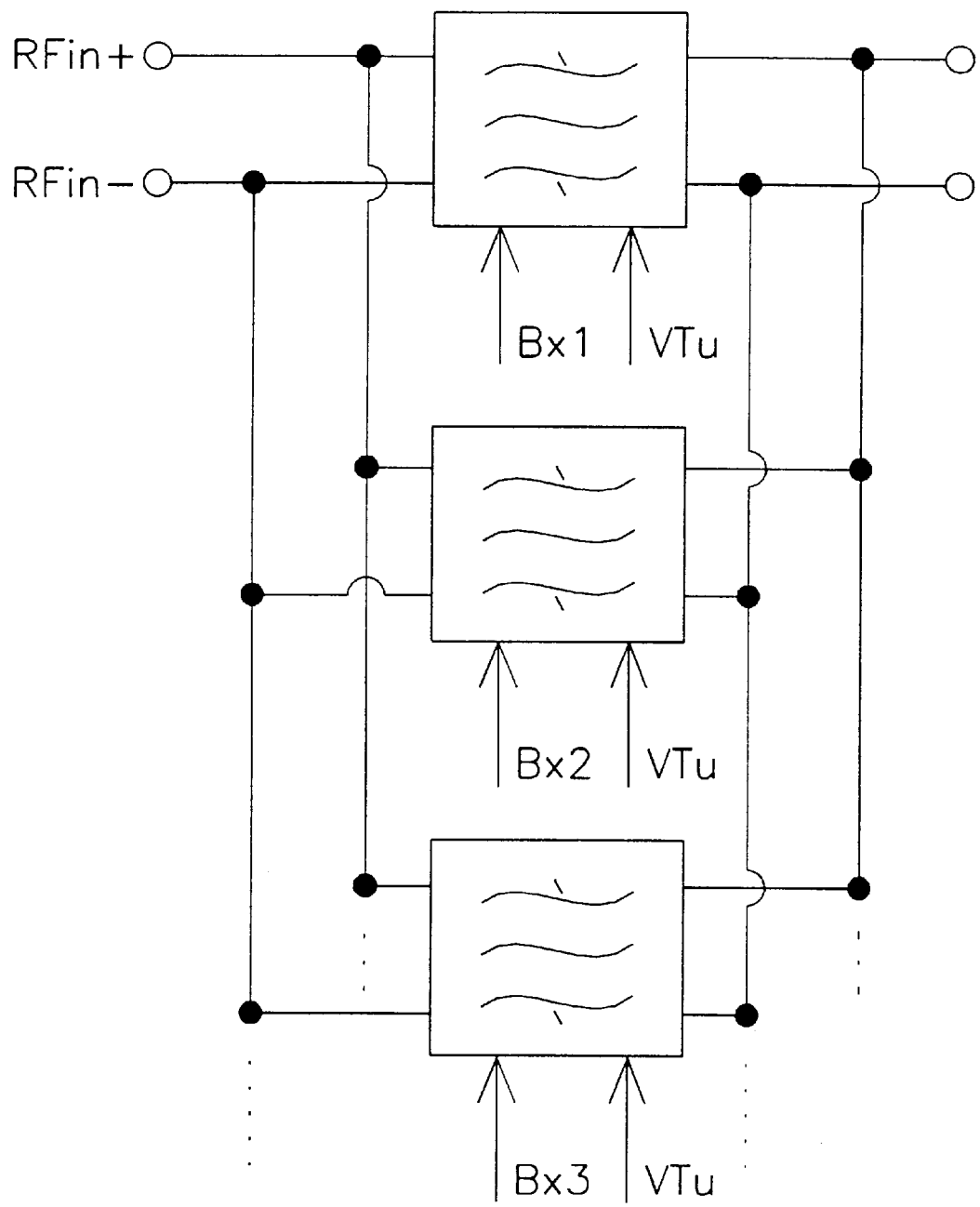
FIG. 5C illustrates the connection when

FIG. 5C demonstrates a connection configuration of the multiple band-pass filters of FIGS. 5A or 5B in a receiver system of multiple frequency bands. Each of the blocks in the circuit diagram of FIG. 5C represents one filter. which may be either the filter of FIG. 5A or 5B. Each of the filters in the system can be controlled by the same fine-tuning signal VTu. However, different switching signals B1, B2, . . . are used to independently activate the desired filter in the multi-band system. Since each filter in the system of FIG. 5C can be constructed to feature different center frequency for band-pass filtering, the entire RF range can therefore be covered if sufficient number of filters are installed. As described above, the change of filter center frequency can be achieved by the use of inductors of different effective inductance.

As mentioned, due to the fact that the use of pre-selection filter 15 in the receiver system of FIG. 4B can be critical in the overall system performance, in particular, noise figure should be carefully set. For example, to improve the noise figure of the pre-selection filter, the selectivity of the filter can be properly set so that the filter loss can be set to be less than 1 dB.

In the receiver system of FIG. 4B, the RF input signal, after being filtered at the pre-selection filter 15 and before being mixed in the double-balanced mixer 11, must be subsequently processed in the low-noise amplifier 1, the DC-coupled buffer 2, the voltage/current linear converter 3, the automatic gain control amplifier 4, the DC-couple buffer 5, and the tracking filter 6. All these circuit elements performed to amplify the input RF signal with low-noise and low-intermodulation characteristics under automatic gain control and tracking filtering.

Note that due to the requirement that the pre-selection filter 15 of the receiver of FIG. 4B must feature lowest possible signal loss, the noise figure of the entire receiver system is determined almost solely by the noise characteristics of the amplifier 1, therefore, in order to pursue the best possible system noise characteristics, the amplifier 1 is normally implemented with the minimum possible number of low-noise components, and avoids the use of directly-connected resistive components along the RF signal path as a means to match input impedance. Instead, inductive or capacitive feedback circuitries are used for achieving the optimized circuit design combining low noise and matched input impedance characteristics. However, unless the amplifier 1 in the receiver system is optimized for special linearization processing, non-linear distortions arise. On the other hand, within the specified frequency ranges, circuitries with optimized inductance or capacitance feedback characteristics are normally equipped with inductors or capacitors too large in their physical sizes to be implementable in ICs. Further, as the automatic gain control amplifier 4 of the receiver system is normally required to process large input signal, in order to prevent severe amplification distortion, special linearization processing is required.

In order to achieve contradicting low-noise and low-distortion characteristics simultaneously in a receiver system, the invention is based on the concept of the utilization of separate circuitries for low-noise amplifier and automatic gain control amplifier. For example, as was depicted in the embodiment of FIGS. 4A and 4B, among the amplifier 1, the buffers 2 and 5, the voltage/current converter 3 and the amplifier 4, amplifier 1 has been designed to exhibit very low noise figure, while the automatic gain control amplifier 4 designed to feature very low distortion.

Figure 6:
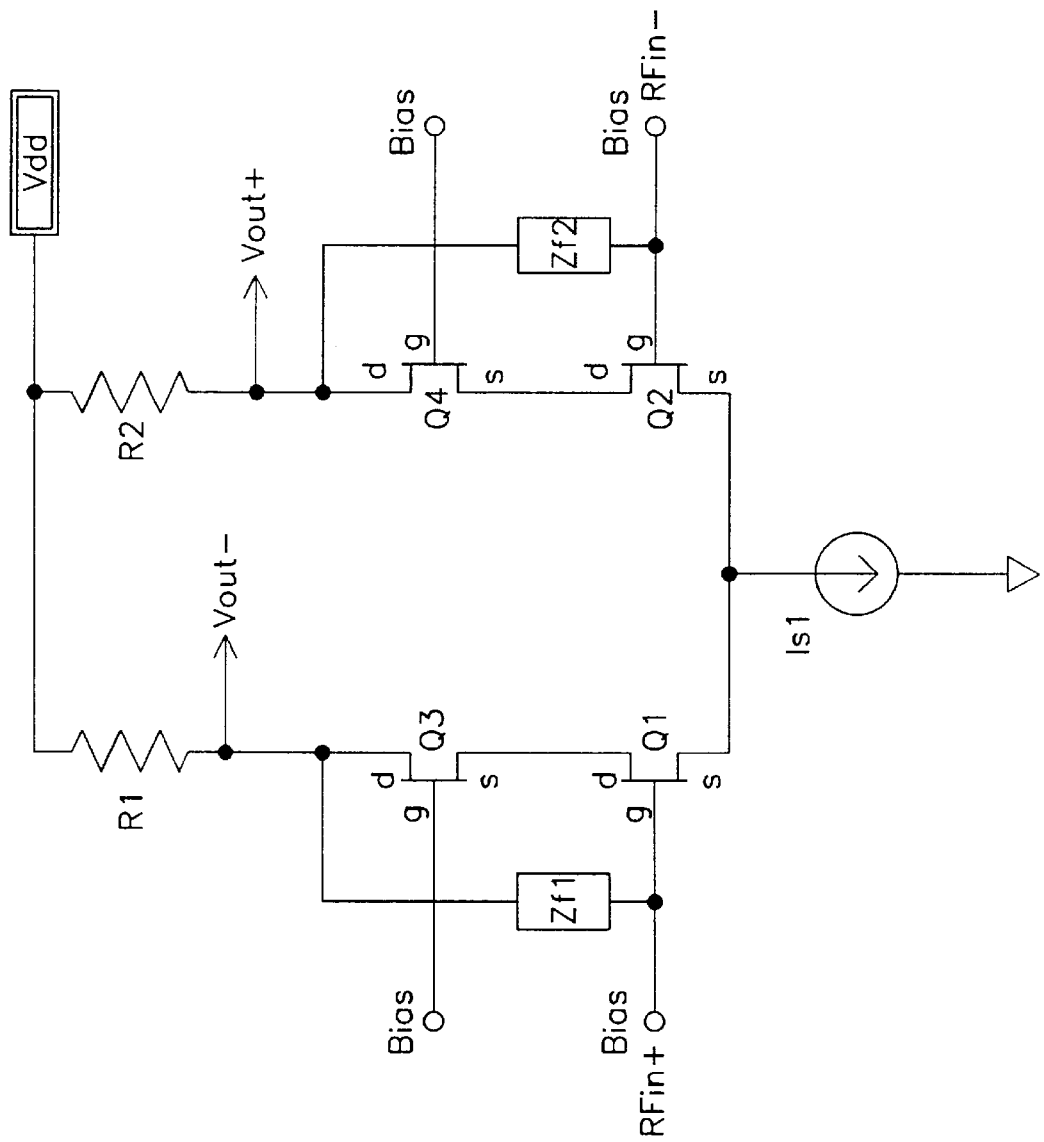
FIG. 6 illustrates the circuit diagram of a preferred embodiment of the low-noise amplifier applicable to the receiver system of FIGS. 4A and 4B.

FIG. 6 illustrates the circuit diagram of a preferred embodiment of the low-noise amplifier 1 employed in the receiver system of FIGS. 4A and 4B. Active elements transistor Q1 and Q2 constitute a differential pair, which, when combined with the output resistor pair R1 and R2, a necessary current source Is1 and adequate bias, make up a differential amplifier. Whenever sufficient power source head room is present, the active differential pair Q1 and Q2 can be cascaded by an additional pair Q3 and Q4, in order to further improve the amplification capability.

Figure 7:
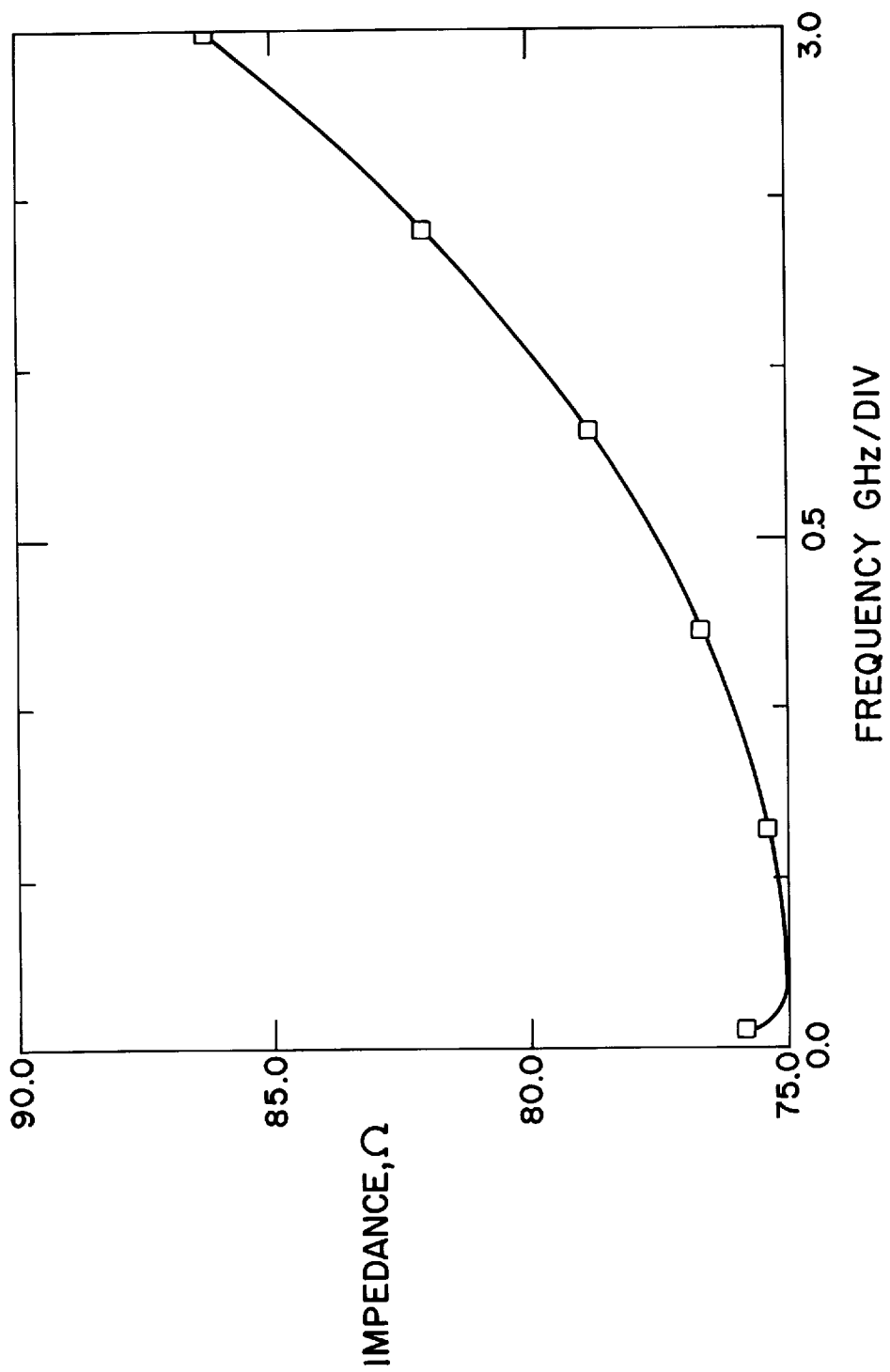
FIG. 7 shows the input impedance characteristics of the differential amplifier of FIG. 6.

RF signal input to the differential amplifier of FIG. 6, either differentially (input signals RFin+ and RFin− supplied to the gate of the transistors Q1 and Q2 respectively) or single-endedly (gates of transistors Q1 and Q2 tied to input signal RFin+ and GND respectively), is amplified in the Q1/Q2 differential pair, and then output differentially at the drains of the cascaded Q3/Q4 pair. If there was no cascaded pair Q3 and Q4 present, the differential output can be obtained at the drains of the Q1/Q2 transistors. In order to improve the circuit stability and linearity, negative feedback passive circuit elements Zf1 and Zf2 can be connected across the input and output ends for the Q1 and Q2 transistors respectively. Each of the passive circuit elements Zf1 and Zf2 can be consisted of networks of resistors, capacitors and/or other passive circuit elements. The inclusion of these negative feedback passive circuit elements Zf1 and Zf2 also provide to bring up the stable matched input impedance (typically at about 75Ω) in the broad frequency range necessary for the differential amplifier. FIG. 7 outlines the input impedance characteristics of the differential amplifier embodiment of FIG. 6. As can be seen in the characteristics curvature, the differential amplifier of FIG. 6 exhibits a relatively stable input impedance characteristics in a wide frequency range, about 75 to 87Ω in the frequency range of about 50 MHz to 3 GHz.

As an embodiment of the low-noise amplifier 1 based on that as depicted in FIG. 6, it includes a first transistor Q1 and a second transistor Q2 connected in a differential pair, and the sources of the first and second transistors Q1 and Q2 are tied together and connected to a current source is 1, and gates of the first and second transistors Q1 and Q2 receive the RF input signal. A first output resistor R1 and a second output resistor R2 are also included, with the first output resistor R1 being connected between the power potential of the apparatus Vdd and the drain of the first transistor Q1, and the second output resistor R2 being connected between the power potential of the apparatus Vdd and the drain of the second transistor Q2. The potential difference between the drains of the first and second transistors Q1 and Q2 becomes the differential output of the low-noise amplifier 1. A first negative feedback element Zf1 and a second negative feedback element Zf2 are also included. The first negative feedback element Zf1 is connected between the drain and the gate of the first transistor Q1, and the second negative feedback element Zf2 is connected between the drain and the gate of the second transistor Q2.

As another embodiment of the low-noise amplifier 1 as depicted in FIG. 6, it includes a first transistor Q1 and a second transistor Q2 connected in a differential pair, the sources of the first and second transistors Q1 and Q2 are tied together and connected to a current source is 1, and gates of the first and second transistors Q1 and Q2 receive the RF input signal. A third transistor Q3 and a fourth transistor Q4 are connected in a differential pair, with the source of the third transistor Q3 being connected to the drain of the first transistor Q1, and the source of the fourth transistor Q4 being connected to the drain of the second transistor Q2, and bias potential being applied to the gates of the third and fourth transistors Q3 and Q4. A first output resistor R1 and a second output resistor R2 are also included. The first output resistor R1 is connected between the power potential of the apparatus Vdd and the drain of the third transistor Q3, and the second output resistor R2 is connected between the power potential of the apparatus Vdd and the drain of the fourth transistor Q4. The potential difference between the drains of the third and fourth transistors Q3 and Q4 becomes the differential output of the low-noise amplifier 1. A first negative feedback element Zf1 and a second negative feedback element Zf2 are also included in the circuitry. The first negative feedback element Zf1 is connected between the drain of the third transistor Q3 and the gate of the first transistor Q1, and the second negative feedback element Zf2 is connected between the drain of the fourth transistor Q4 and the gate of the second transistor Q2.

Figure 8:
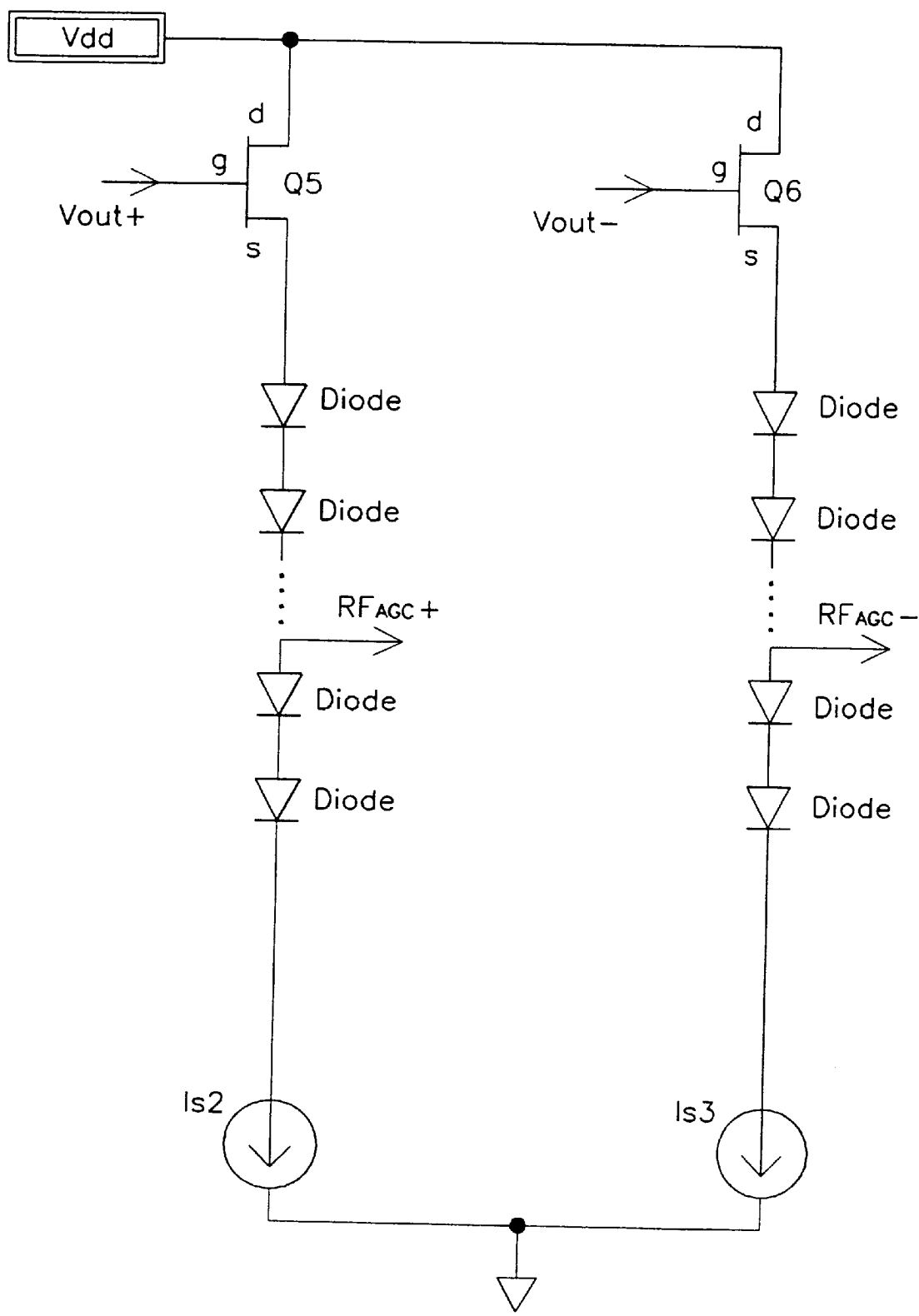
FIG. 8 shows the schematic diagram of the DC-coupled buffer used to buffer the output of the differential amplifier of FIG. 6.

Referring again to FIGS. 4A and 4B, the processed RF signal as output by the differential amplifier 1 is buffered at the DC-coupled buffer 2 before being sent to the automatic gain control amplifier 4. An embodiment of such DC-coupled buffer is shown in the schematic diagram of FIG. 8. As illustrated, a pair of series-connections of a transistor, a cascade of diodes and a current source are further connected in parallel across the system power and ground potentials to constitute the DC-coupled buffer. Essentially, transistors Q5 and Q6 are connected to their corresponding current sources Is2 and Is3 with the corresponding cascade of diodes to serve as the source followers for the buffer positive and negative outputs respectively. These source followers of the DC-coupled buffer are capable of preventing signal reverse. The unit-gain signals drawn from the transistor sources, after suitable voltage drop across the cascade of a proper number of diodes, may provide as the input signal for the next stage of circuitry, and provide the suitable bias for the next input transistor stage.

Figure 9:
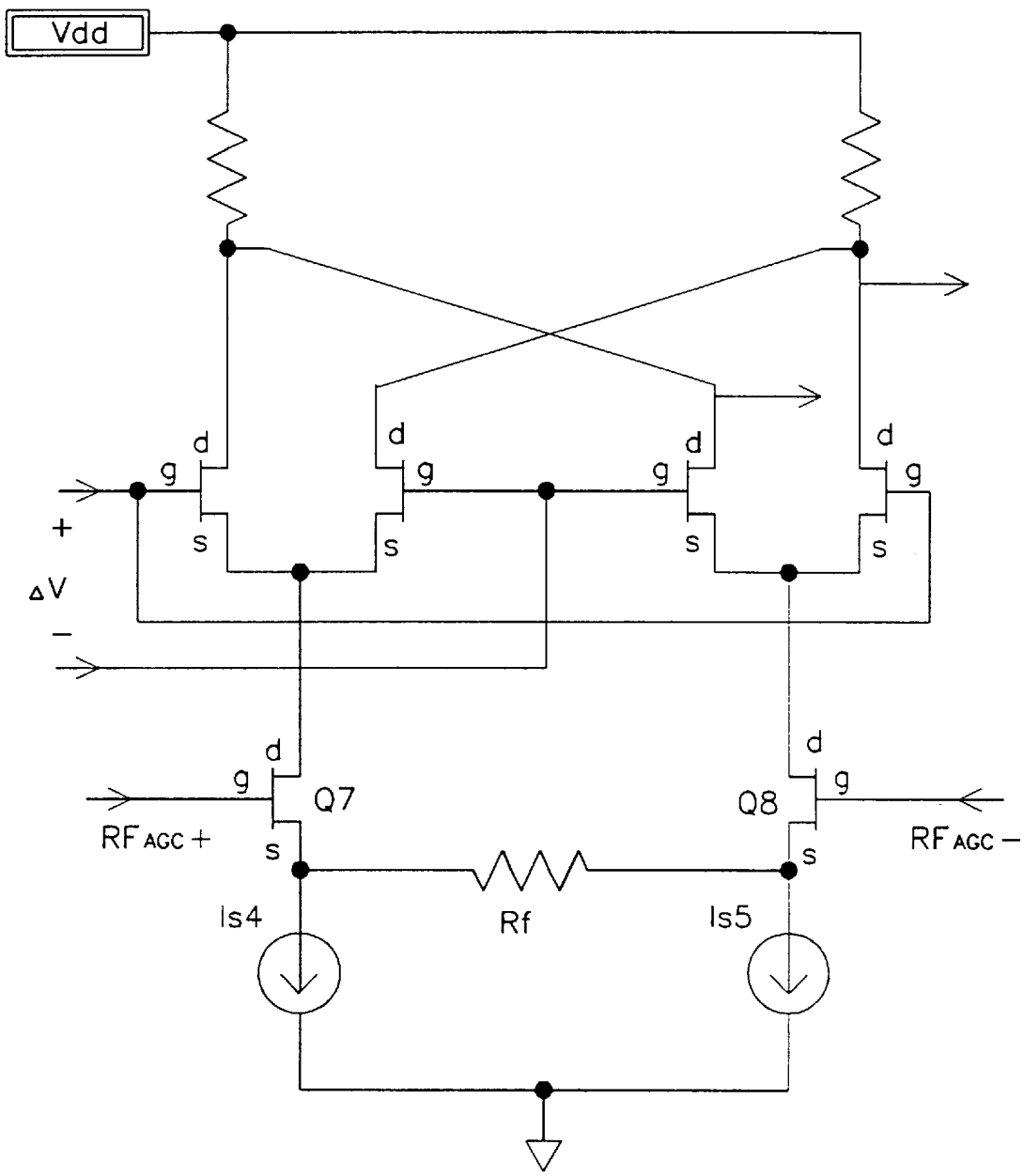
FIG. 9 shows the schematic diagram of the preferred embodiments of the combination of the voltage/current linear converter and the differential automatic gain control amplifier that can be employed in the receiver system of FIGS. 4A and 4B.

FIG. 9 depicts the schematic diagram of the preferred embodiments of the combination of the voltage/current linear converter 3 and the differential automatic gain control amplifier 4 that can be employed in the receiver system of FIGS. 4A and 4B. The circuitry shown in FIG. 9 includes a fully differential automatic gain control amplifier whose gain can be determined by the voltage difference $\Delta V$ across the two control input signals to the left of the circuitry. Over $-40$ dB gain suppression rate can be obtained by sustained reduction in this voltage difference $\Delta V$.

The lower half of the circuitry outlined in FIG. 9, namely, the circuitry consisting of the two transistors Q7 and Q8, resistor Rf, and current sources Is3 and Is4, is one that is capable of performing voltage/current conversion, with good linearity. In other words, this circuitry can be used as the voltage/current linear converter 3 for the receiver system of FIGS. 4A and 4B.

As is seen in FIGS. 4A and 4B, the output of the differential automatic gain control amplifier 4 also requires the buffering of a DC-coupled buffer, namely buffer 5 in the drawing, before can be input to the tracking filter 6 at the next circuit stage. Further, the tracking filter 6 is used to performs a function basically the same as that of the pre-selection filter 15 used in the receiver system. As a result, the filter of FIGS. 5A and 5B can also be used as the tracking filter in this case. However, since the filter loss in the tracking filter 6 has little impact on the noise figure of the entire receiver system, therefore, the circuit parameters for the filter circuitry of FIGS. 5A and 5B, when applied as the tracking filter 6, can be concentrated on the frequency selectivity. In other words, though the pre-selection filter 15 and the tracking filter 6 for the receiver system of the invention (FIGS. 4A and 4B) shares the same circuit configuration, but different circuit characteristics emphasis can be placed by selecting circuit components of different values. For example, tracking filter 6 requires to be constructed as one with narrower pass band than the pre-selection filter 15. On the other hand, the pre-selection filter 15, other than its intended functionality of minimizing interference from irrelevant frequency channels, also emphasizes improved noise figure.

Figure 10:
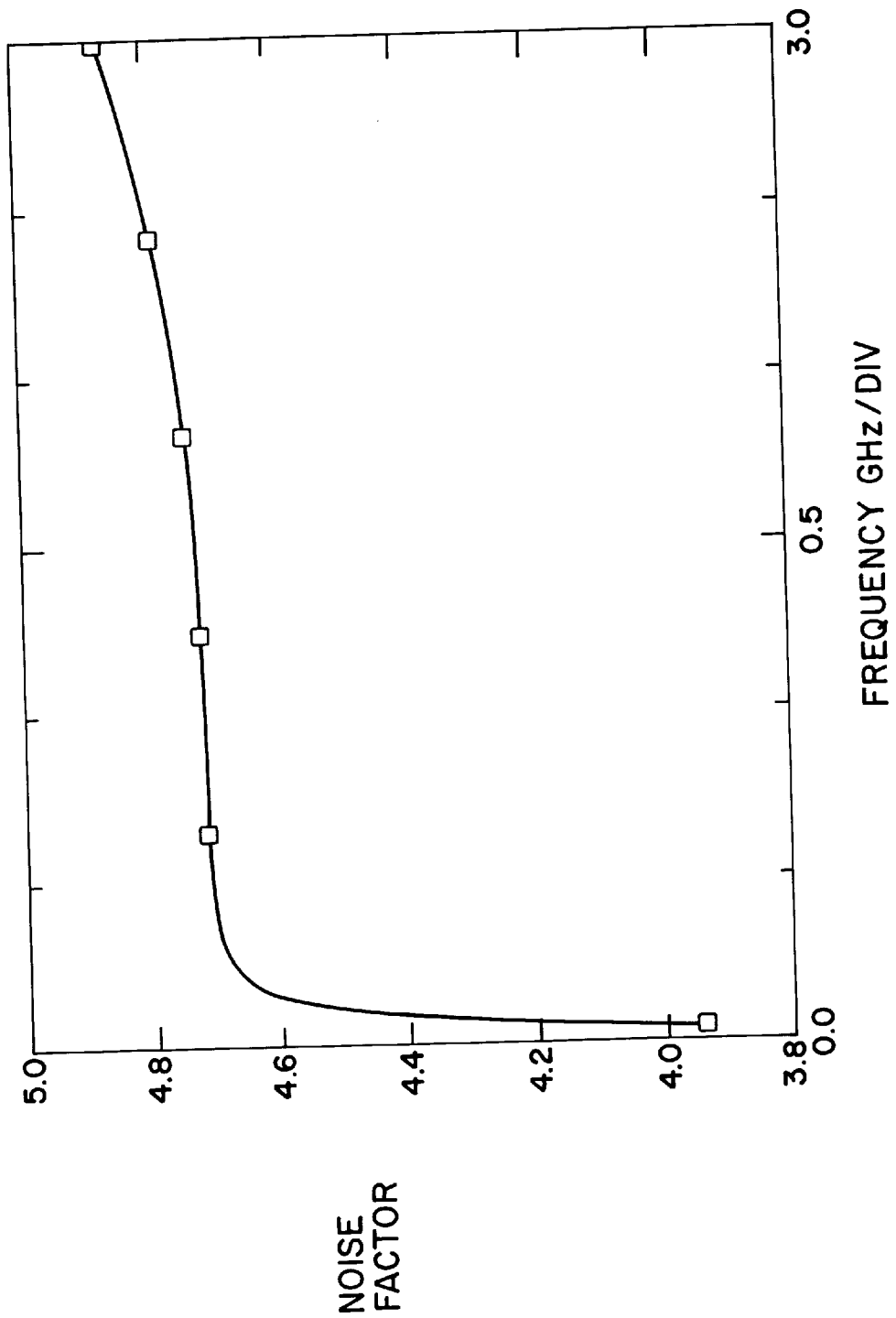
FIG. 10 shows the noise figure characteristics of the receiver system of the invention.

FIG. 10 shows the noise figure characteristics of the receiver system of the invention as embodied in FIGS. 4A and 4B. As can be observed in the chart, the receiver system of the invention is capable of processing the RF input signal of a very broad frequency range while enjoying very low noise figure. For example, based on a circuitry built around pseudo-morphic high electron mobility transistors (PHEMT components), a noise figure characteristics of less than 4.9 dB across the frequency range of 50 MHz to 3 GHz can be obtained. With this circuitry, the entire receiver system should be able to enjoy a noise figure as low as about 6 dB, since all other components in the system add little to the noise.

Figure 11A:
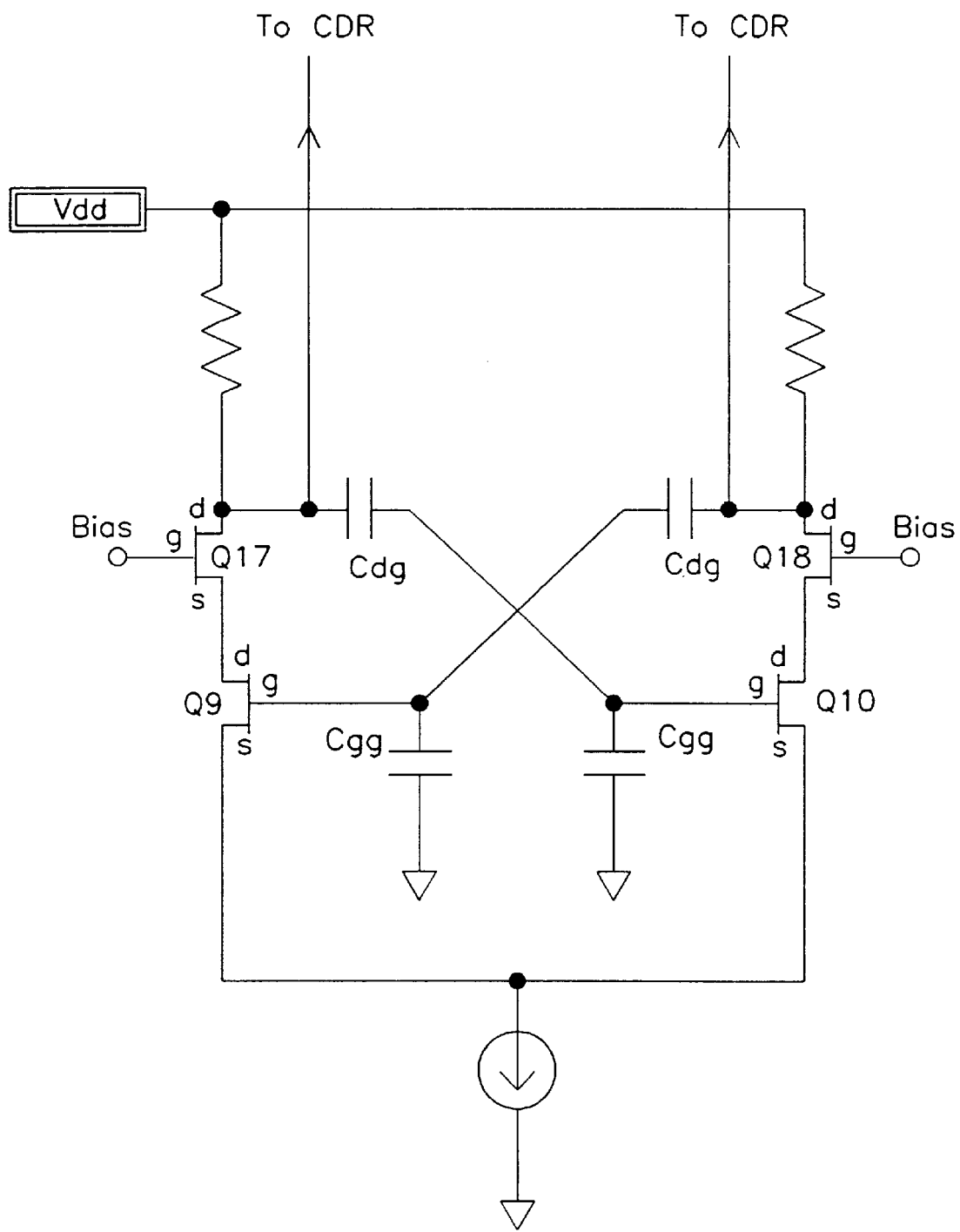
FIG. 11A shows the schematic diagram of a preferred embodiment of the multivibrating oscillator used for the voltage-controlled oscillator core employed in the receiver system of the invention.

In the receiver system of FIG. 4A or 4B, the voltage-controlled oscillator core 8, the resonator 9, the DC-coupled buffer 10 and the phase-locked loop controller 14 constitute a complete phase-locked loop system. The schematic diagram of a circuitry that can be used as the voltage-controlled oscillator core 8 is shown in FIG. 11A. The preferred embodiment of the voltage-controlled oscillator core 8 for the receiver system of the invention as outlined in the drawing has a multivibrator circuit configuration. This includes a differential pair of transistors Q9 and Q10, with an optional (if increased amplification gain is required) pair of another two transistors Q17 and Q18 arranged as differential pair, together with a pair of output resistors and a current source, establish a differential amplifier. Each of the two inputs of the established differential amplifier is cross-feedback from a corresponding positive output of the amplifier itself via the corresponding capacitors Cdg and Cgg. This produces a multivibrating oscillator circuitry which generates a stable oscillation when the closed-loop gain of the circuitry is unity and the phase shift is 360 degrees.

Figure 11B:
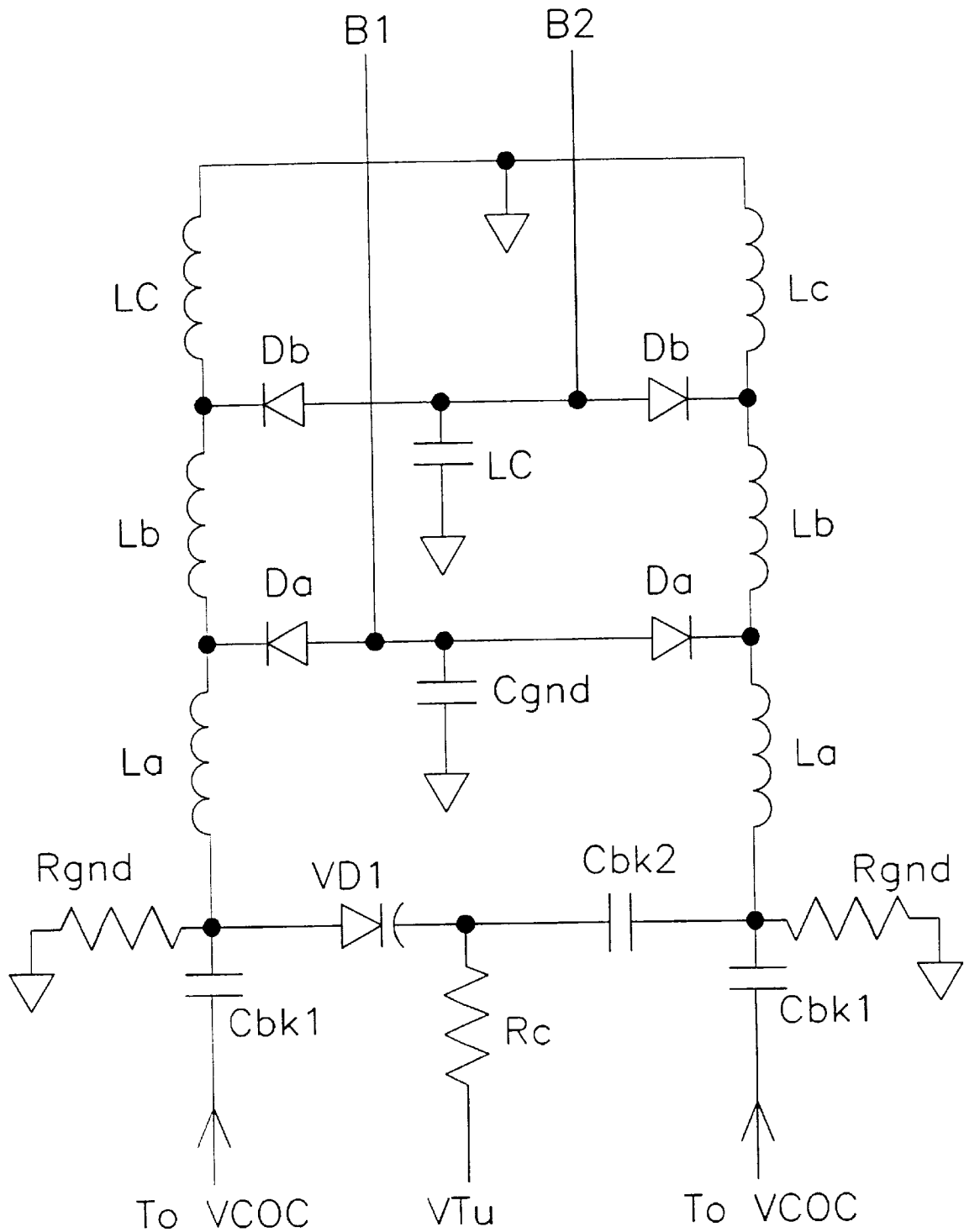
FIG. 11B shows the schematic diagram of a preferred embodiment of the configurable differential resonator employed in the receiver system of the invention.

FIG. 11B is a schematic diagram of a preferred embodiment of the configurable differential resonator applicable to the receiver system as outlined in FIGS. 4A and 4B. The resonator of FIG. 11B can be combined with the multivibrating oscillator of FIG. 11A to construct a switchable differential type voltage-controlled oscillator that constitutes an important part of the invention. Supplemental to the voltage-controlled oscillator of FIG. 11A, the resonator of FIG. 11B determines the oscillation frequency of the constructed voltage-controlled oscillator. The multivibrating signals generated by the oscillator of FIG. 11A at the drains of the transistors Q17 and Q18 are relayed to the resonator of FIG. 11B via two coupling capacitors Cbk1 that serve to block DC signals. Two large resistance resistors Rgnd respectively coupled to the coupling capacitors Cbk1 are used to provide the necessary DC path for the resonator. The varactor VD1 and a series capacitor Cbk2 are connected across the two input signals for the resonator. The fine-tuning control signal VTu generated by the phase-locked loop controller 14 of the receiver system is fed into the node joining the capacitor Cbk2 and the varactor VD1 via a resistor Rc. This applies a reverse bias to the varactor VD1, causing the varactor to exhibit appropriate capacitance.

On the other hand, the resonator inductor is made up of two sets of series-connected inductors La, Lb and Lc and two corresponding sets of switching diodes Da and Db. Through control of the band switch signals B1 and B2 applied to the diodes Da and Db (corresponding to the band switch signal BSs in the receiver system of FIGS. 4A and 4B), frequency band selection can be achieved. The following is a description of the selection operation in the voltage-controlled oscillator of FIGS. 11A and 11B based on a three-band switching scheme VHF-low/VHF-High/UHF. Based on the operating principle of voltage-controlled oscillator, the resonance frequency can be determined in the following expression:

$$f_{OSC} = \frac{1}{2\pi\sqrt{LC}} \qquad (1)$$

Based on properly selected inductance values La, Lb and Lc, there can be three frequencies obtained for the three frequency bands. Namely, for the UHF frequency band, there is $$f_1 = \frac{1}{2\pi\sqrt{LaC}},$$

for the VHF-high frequency band, there is $$f_2 = \frac{1}{2\pi\sqrt{(La+Lb)C}},$$

and for the VHF-low frequency band, there is $$f_3 = \frac{1}{2\pi\sqrt{(La+Lb+Lc)C}}.$$

To obtain the oscillation frequency for the UHF frequency band, B1 signal applied to the Da diode of the resonator of FIG. 11B conducts the both Da diodes. This turns the Cgnd capacitor connected to the positive terminals of the two Da diodes into a ground-connecting path for AC signals that appear. In this case, only the inductor La and the varactor VD1 take part in the role of a resonator circuitry (since, in this situation, inductors Lb and Lc are isolated by grounding). Voltage-controlled oscillation is achieved for the UHF frequency band.

In another occasion, to obtain the oscillation frequency for the VHF-high frequency band, B1 signal is applied to block the diodes Da, while B2 signal is controlled to conduct the Db diodes at the same time. This turns the Lc capacitor connected to the positive terminals of the two Db diodes into a ground-connecting path for AC signals that appear. Thus inductors La and Lb, together with the varactor VD1 constitute the resonator circuitry, and the voltage-controlled oscillation is achieved for the VHF-high frequency band.

In the third situation, to obtain the oscillation frequency for the VHF-low frequency band, both B1 and B2 signals are controlled to block both the Da and Db diodes so that all three inductors La, Lb and Lc join the varactor VD1 to take part in the voltage-controlled oscillation of the oscillator circuitry.

Note, as is easily appreciable to persons skilled in the art, based on the circuitry embodiments of FIGS. 11A and 11B, frequency band arrangement of more than three can be easily constructed by, for example, adding more inductor/diode/capacitor stages cascaded in the resonator circuitry of FIG. 11B.

For a detailed description of the circuitry embodiment of the voltage-controlled oscillator core, refer to FIGS. 11A and 11B again. In an embodiment based on the circuitry depicted in FIG. 11A, the core has a first transistor Q9 and a second transistor Q10 connected in a differential pair, with the sources of the first and second transistors Q9 and Q10 being tied together and connected to a current source, and with gates of the first and second transistors Q9 and Q10 being connected to the ground potential of the apparatus via a corresponding first and second capacitor Cgg, the drain of the first transistor Q9 being connected to the gate of the second transistor Q10 across a third capacitor Cdg, and the drain of the second transistor Q10 being connected to the gate of the first transistor Q9 across a fourth capacitor Cdg. A first load resistor and a second load resistor are also included, with the first load resistor being connected between the drain of the first transistor Q9 and the power potential of the apparatus Vdd, and the second load resistor being connected between the drain of the second transistor Q10 and the power potential of the apparatus Vdd. The voltage-controlled oscillator core initiates a stable oscillation when the gain thereof reaches unity and the phase shift thereof reaches 360 degrees.

In another embodiment as depicted in the drawing, the voltage-controlled oscillator core has a first transistor Q9 and a second transistor Q10 connected in a differential pair, the sources of the first and second transistors Q9 ands Q10 are tied together and connected to a current source, and gates of the first and second transistors Q9 and Q10 are also connected to the ground potential of the apparatus via a corresponding first and second capacitor Cgg. A second transistor Q17 and a fourth transistor Q18 connected in a differential pair are also included in the circuitry. The source of the third transistor Q17 is connected to the drain of the first transistor Q9, the source of the fourth transistor Q18 is connected to the drain of the second transistor Q10, the drain of the third transistor Q17 is connected to the gate of the second transistor Q10 across a third capacitor Cdg, and the drain of the fourth transistor Q18 is connected to the gate of the first transistor Q9 across a fourth capacitor Cdg. A first load resistor and a second load resistor are also included, with the first load resistor being connected between the drain of the third transistor Q17 and the power potential of the apparatus Vdd, and the second load resistor being connected between the drain of the fourth transistor Q18 and the power potential of the apparatus Vdd. The voltage-controlled oscillator core initiates a stable oscillation when the gain thereof reaches unity and the phase shift thereof reaches 360 degrees.

As an embodiment of the resonator that governs the oscillation of the voltage-controlled oscillator core described above, refer to FIGS. 11A and 11B again. The resonator has a first DC blocking capacitor Cbk1 and a second DC blocking capacitor Cbk1 having the first end thereof connected to the drains of the first and second transistors Q9 and Q10 of the voltage-controlled oscillator core for blocking DC signal. A first and second resistor Rgnd having the first end thereof connected to ground potential of the apparatus and the second end thereof connected to the second end of the corresponding first and second DC blocking capacitors Cbk1 provide the DC signal paths. A varactor VD1 has first end thereof connected to the second end of the first DC blocking resistor Cbk1. A third DC blocking capacitor Cbk2 is connected between the second end of the varactor VD1 and the second end of the second DC blocking resistor Rgnd. An input resistor Rc has the first end thereof receives a frequency fine-tuning control signal VTu output by the phase-locked loop controller, and the second end thereof connected to the second end of the varactor VD1, and the frequency fine-tuning control signal generates a reverse bias to the varactor VD1 to cause the varactor exhibiting appropriate capacitance. A first inductor pair La and a first switching diode pair Da are also included. The first end of the first inductor pair La is connected to the second end of the first and second DC blocking capacitors Cbk1 respectively, the negative terminal of first diode pair Da is connected to the second end of the first inductor pair La respectively, and the positive terminal of the first diode pair Da is connected to a first band switching control signal B1 and the first ground-connecting capacitor Cgnd respectively. A second inductor pair Lb and a second switching diode pair Db are also included. The first end of the second inductor pair Lb is connected to the second end of the first inductor pair La respectively, the negative terminal of second diode pair Db is connected to the second end of the first inductor pair La respectively, and the positive terminal of the first diode pair Da is connected to a second band switching control signal B2 and the second ground-connecting capacitor respectively. A third inductor pair Lc has the first end thereof connected to the second end of the second inductor pair Lb respectively, and the second end of the third inductor pair Lc is connected to ground potential respectively. The apparatus generates an output signal in one of three different frequency bands including a first frequency band when the first band switching control signal B1 has a high status and the second band switching control signal B2 has a high status, a second frequency band when the first band switching control signal B1 has a low status and the second band switching control signal B2 has a high status, and a third frequency band when the first band switching control signal B1 has a low status and the second band switching control signal B2 has a low status.

Figure 12A:
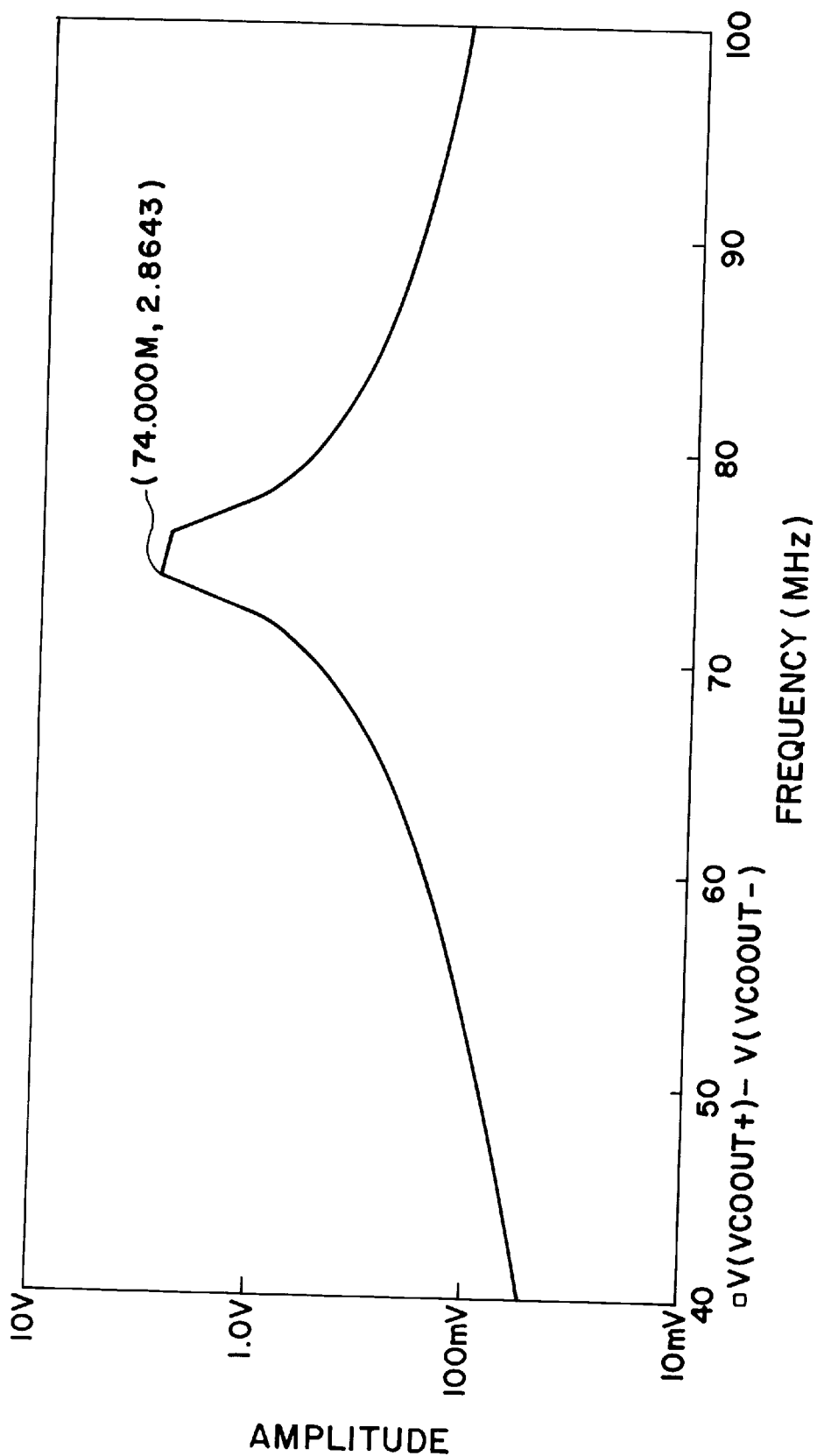
FIG. 12A shows the oscillator characteristics of the voltage-controlled oscillator constructed using the multivibrating oscillator of FIG. 11A and the configurable resonator of FIG. 11B and operating in the frequency range of under 80 MHz.
Figure 12B:
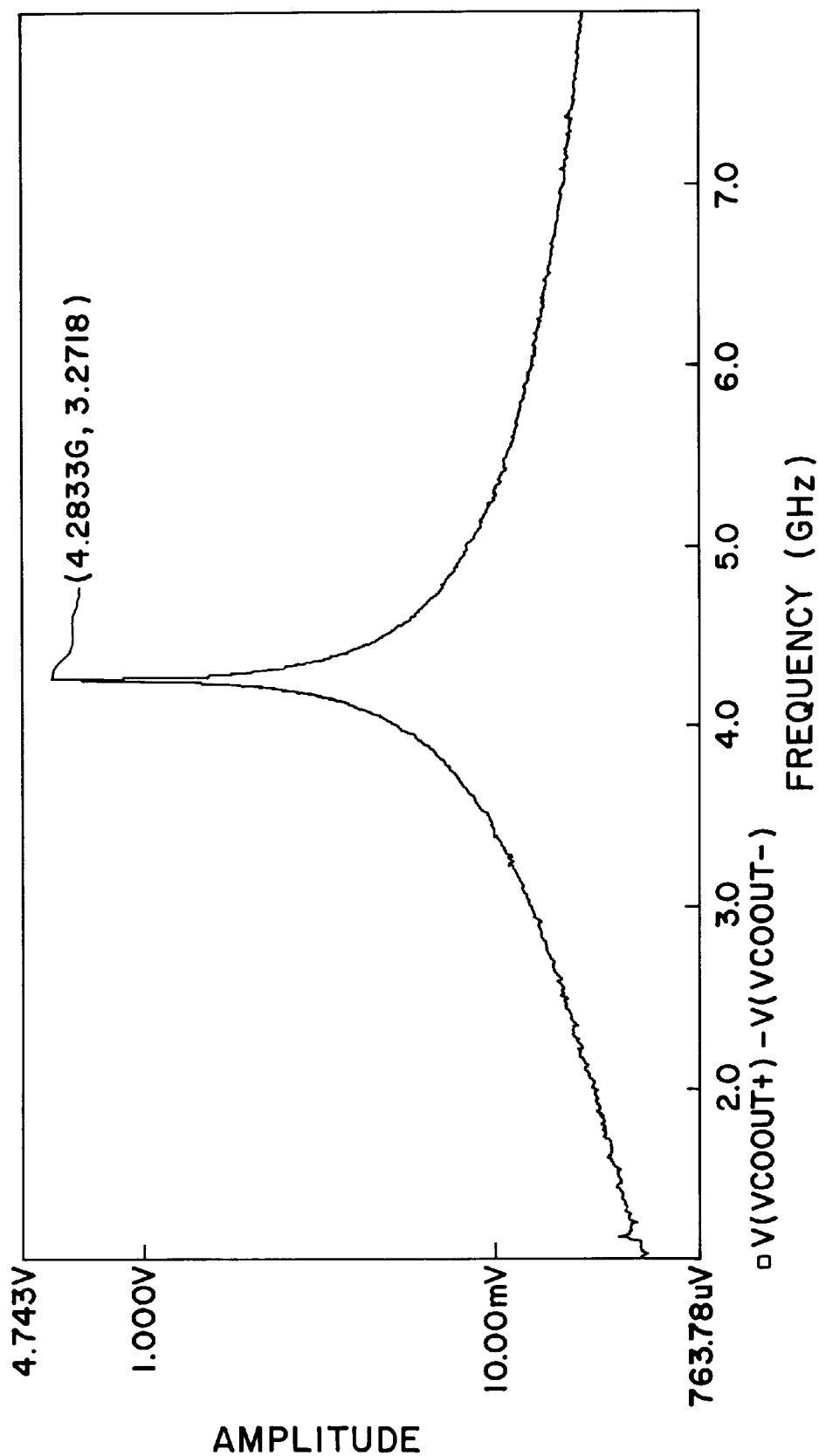
FIG. 12B shows the oscillator characteristics of the voltage-controlled oscillator constructed using the multivibrating oscillator of FIG. 11A and the configurable resonator of FIG. 11B and operating in the frequency range of above 4 GHz.

FIGS. 12A and 12B respectively show the oscillator characteristics of the voltage-controlled oscillator constructed using the circuitries of FIGS. 11A and 11B. FIG. 12A shows the oscillator characteristics while operating in the frequency range of under 80 MHz, while FIG. 12B shows the characteristics above 4 GHz. As is observable in the characteristics curvatures, broad frequency range applicability is possible.

Figure 13A:
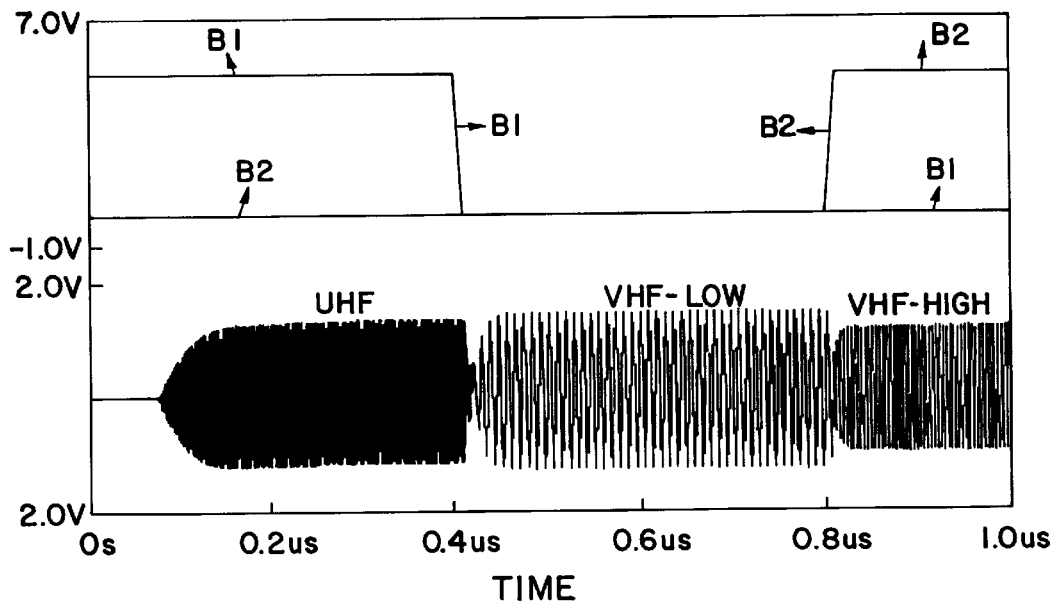
FIG. 13A shows the time-domain output of the voltage-controlled oscillator constructed using the multivibrating oscillator of FIG. 11A and the configurable resonator of FIG. 11B as the frequency band is switched among three ranges.
Figure 13B:
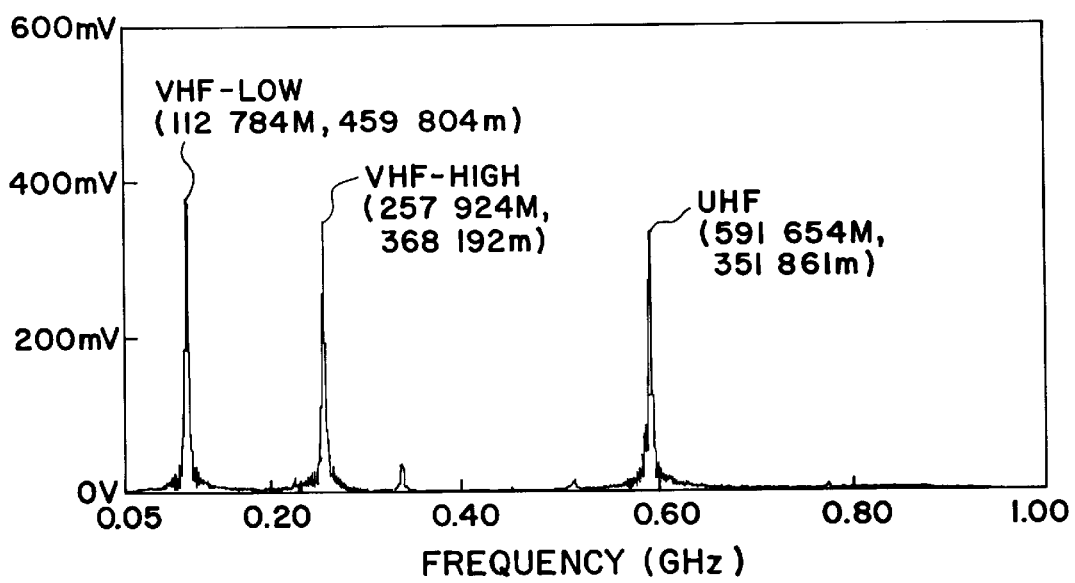
FIG. 13B shows the frequency spectrum of the voltage-controlled oscillator constructed using the multivibrating oscillator of FIG. 11A and the configurable resonator of FIG. 11B as the frequency band is switched among three ranges.

FIG. 13A shows the time-domain output of the voltage-controlled oscillator constructed using the multivibrating oscillator of FIG. 11A and the configurable resonator of FIG. 11B as the frequency band is switched among three ranges. The time-domain waveform at the top of FIG. 13A shows the band switching signals B1 and B2 as they are controlled to facilitate switching between the UHF, VHF-high and VHF-low bands of frequencies, while the waveform at the bottom is the corresponding frequency output of the circuitries of FIGS. 11A and 11B. FIG. 13B shows the frequency spectrum of the voltage-controlled oscillator constructed using the multivibrating oscillator of FIG. 11A and the configurable resonator of FIG. 11B as the frequency band is switched among the three ranges. Switching is shown to be facilitated among the three frequency ranges UHF, VHF-high and VHF-low at about 591, 257 and 112 MHz respectively.

Referring back to FIGS. 4A and 4B, it is seen that the buffered output of the voltage-controlled oscillator core 8 is input to two circuitries, among which one being the phase-locked loop controller 14, and the other being the double-balanced mixer 11. The oscillator input to the phase-locked loop controller 14 is used to implement frequency detect and locking, while the input to the double-balanced mixer 11 is for mixing with the amplified version of the input RF signal. The phase-locked loop controller 14 can be constructed using the typical IC circuitry available. It is used to receive the channel data CDs to generate a set of band switching signals B1, B2, . . . and Bn (BSs in the terminology of FIGS. 4A and 4B) as well as a frequency fine-tuning signal VTu that can be output to the configurable differential resonator for controlling the oscillator frequency. Meanwhile, the phase-locked loop controller 14 also compares the received oscillator signal to the base frequency in order to adjust the generated VTu signal so that the voltage-controlled oscillator core can be locked to the designated frequency. Essentially, frequency dividers internal to the phase-locked loop controller 14 divides the received oscillation signal and compares the frequency-down signal to the reference frequency for determining whether or not the voltage-controlled oscillator core had deviated from the set oscillation frequency.

Figure 14:
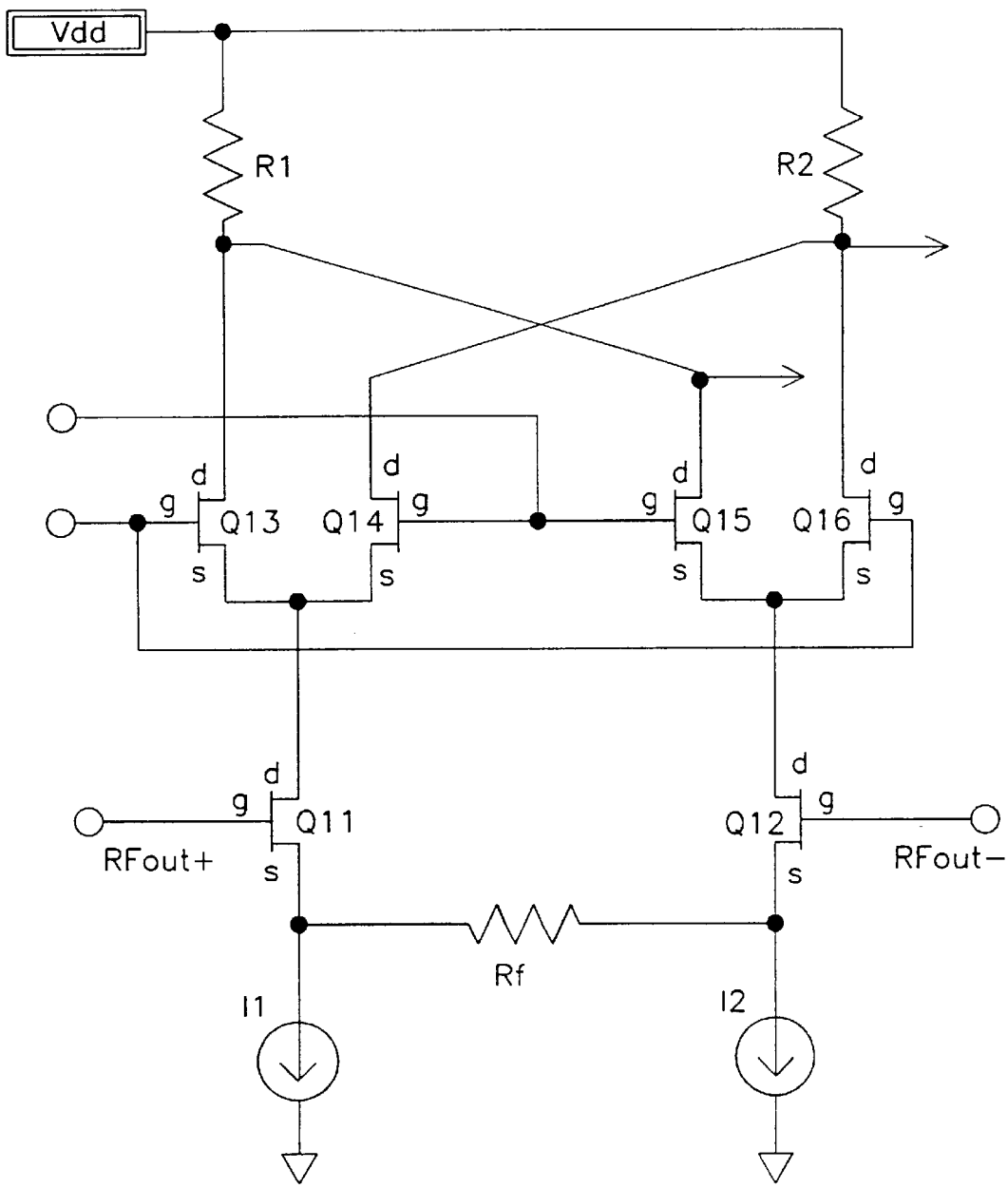
FIG. 14 is the schematic diagram of a low-distortion full mixer that can be used as the combined circuitry of the double-balanced mixer and the voltage/current linear converter of the receiver system of FIGS. 4A and 4B.

FIG. 14 is the schematic diagram of a low-distortion full mixer that can be used as the combined circuitry of the double-balanced mixer 11 and the voltage/current linear converter 7 of the receiver system of FIGS. 4A and 4B. Specifically, the RF input signal, after being amplified and tracking-filtered (as output by the tracking filter 6 of the receiver of FIGS. 4A and 4B) can be input to the lower half of the circuitry of FIG. 14. This lower half of circuitry that includes the two transistors Q11 and Q12, as well as the resistor Rf and the two current sources I1 and I2 is a linear current converter that is functionally equivalent to the converter 7 of the receiver system of FIGS. 4A and 4B. On the other hand, the oscillator signal can be input to the upper half of the circuitry of FIG. 14. This upper half of circuitry that includes the four transistors Q13, Q14, Q15 and Q16 constructing a differential set can be used to mix the RF input signal with the desired oscillator input signal. Output thereof is then converted into voltage signals by the resistors R1 and R2. The mixed signal output as generated by the mixer 11 and then buffered by the DC-coupled buffer 12 of the receiver system of FIGS. 4A and 4B can then be input to a next IF filter 13. Normally, surface acoustic filter elements can be used as the IF filter 13, in order to pick up the final IF signal (such as the 45.75 MHz signal of the U.S. standard) to be processed in the subsequent signal demodulation operations.

Figure 15:
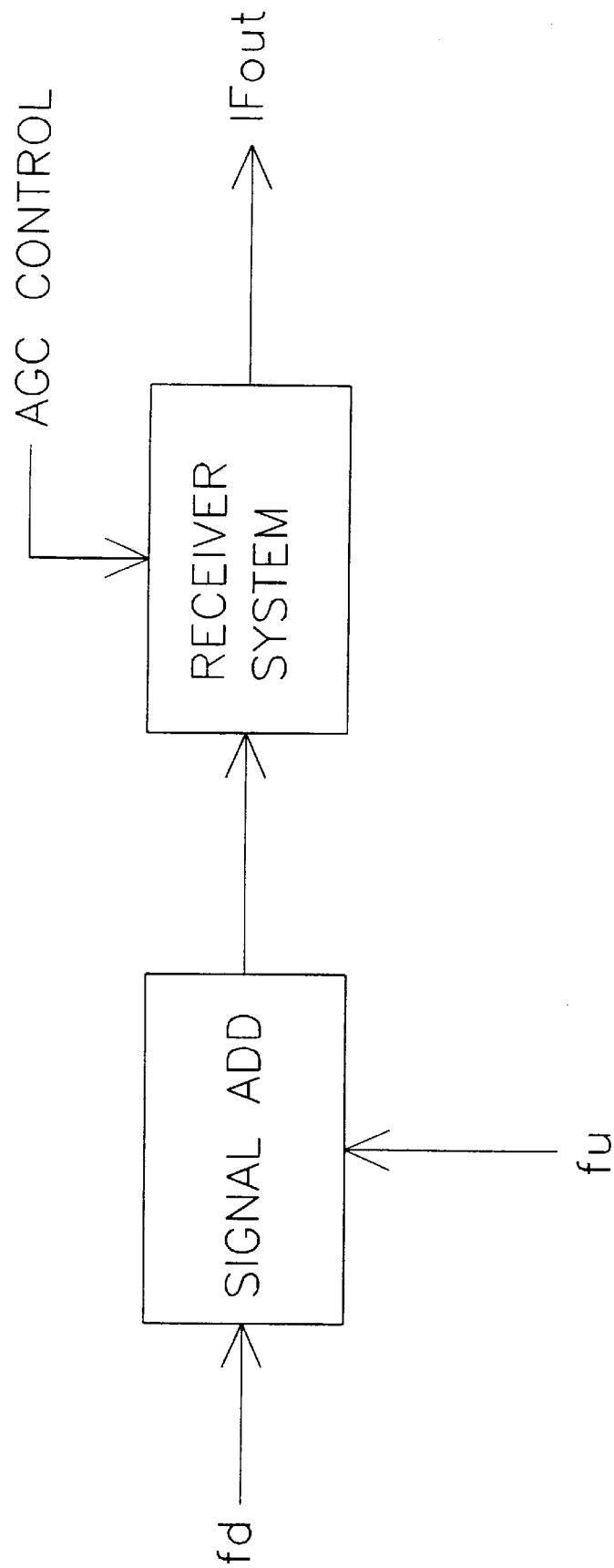
FIG. 15 is a block diagram schematically depicting the set up for measuring intermodulation in a receiver system.

FIG. 15 is a block diagram schematically depicting the set up for measuring intermodulation in a receiver system. In the measurement set up, signal from the desired channel fd and signal from the undesired channel fu are input to the measured receiver system simultaneously. In this scheme, the undesired channel fu in the cable TV system can be the channel after next of the intended channel fd. Namely, fu=fd±12 MHz. In the case of broadcast TV, the undesired channel fu can be the channel next to the intended channel fd, fu=fd±6 MHz. Under an ideal situation, the final IF output signal IFout should contain only the signal in the designated fd channel, but in practice, relatively small amount of energy represented by the signal from the fu channel would also be contained in the IFout signal to cause noticeable interference. This is due to the fact that distortions in receivers are inherent. As the fu energy becomes more excessive, the interference becomes more noticeable. When the interference energy reaches to a level where the interference signal amplitude is about 1% of the IFout signal, the input fu energy of 1% becomes an index for intermodulation. Expressed normally in units of dB$\mu$V, the larger the index, the smaller the receiver intermodulation.

Figure 16:
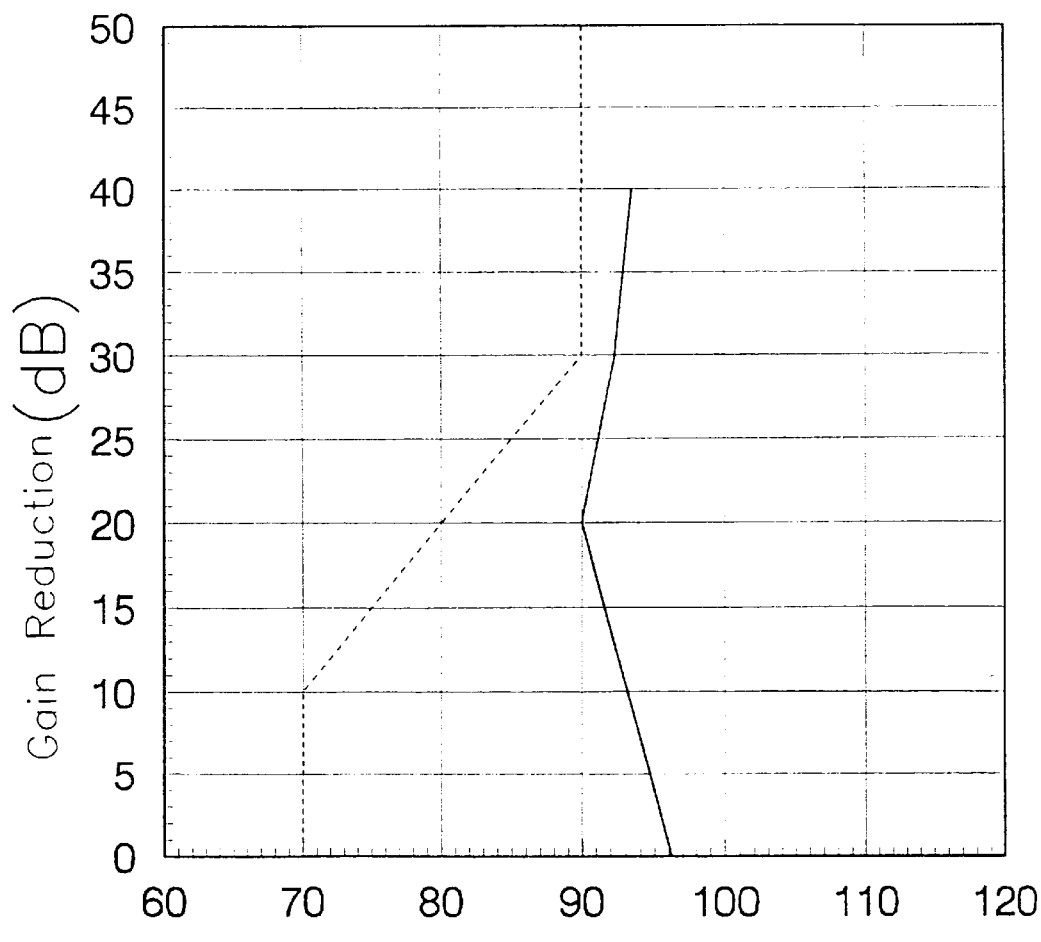
FIG. 16 is a characteristics curvature showing the intermodulation of the receiver system of the invention.

FIG. 16 shows that the receiver system of the invention can indeed achieve a very low intermodulation. The dotted line in FIG. 16 is the specification of 1% cross modulation for a typical receiver system. The solid line, on the other hand, shows that the 1% cross modulation characteristic of the receiver system of the invention. During the test, the fd used is 789.25 MHz, and fu is 801.25 MHz. In FIG. 16, the horizontal axis represents the fu signal intensity, and the vertical axis represents the AGC attenuation as the IFout is maintained at the designated intensity. In other words, the vertical axis is the fd intensity increase rate expressed in dB.

An inspection in the characteristics curvature of FIG. 16 shows that the receiver system of the invention performs better than the 1% cross modulation specification under all fd intensities tested. Especially, when fd signal is extremely weak (at about 60 dB$\mu$V), the fu signal must be greater than 95 dB$\mu$V in order to meet the 1% intermodulation requirement. In all, though the 1% cross modulation of the receiver system of the invention was found to be slightly different under different fd signal intensities, however, it had been maintained in the range of about 90 to 95 dB$\mu$V. Further to be noticed is the fact that the characteristics curvature of the receiver system of the invention was obtained in the UHF band, which indicates that the inventive receiver system is capable of maintaining low intermodulation even operating at the high frequency range.

Figure 17:
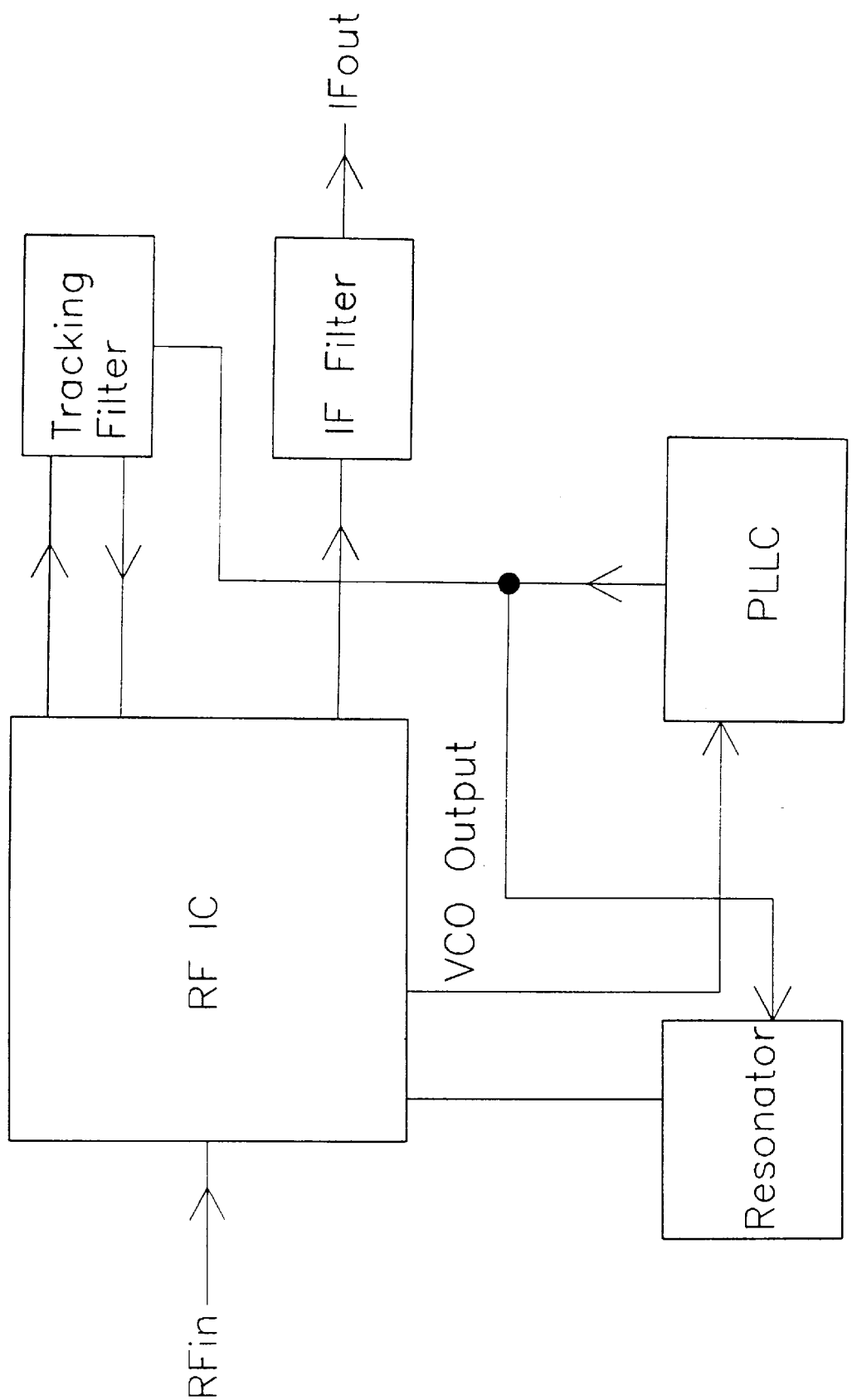
FIG. 17 is a block diagram showing how the receiver system of the invention can be combined with a few other components to build a cable/broadcast TV tuner.
Figure 18:
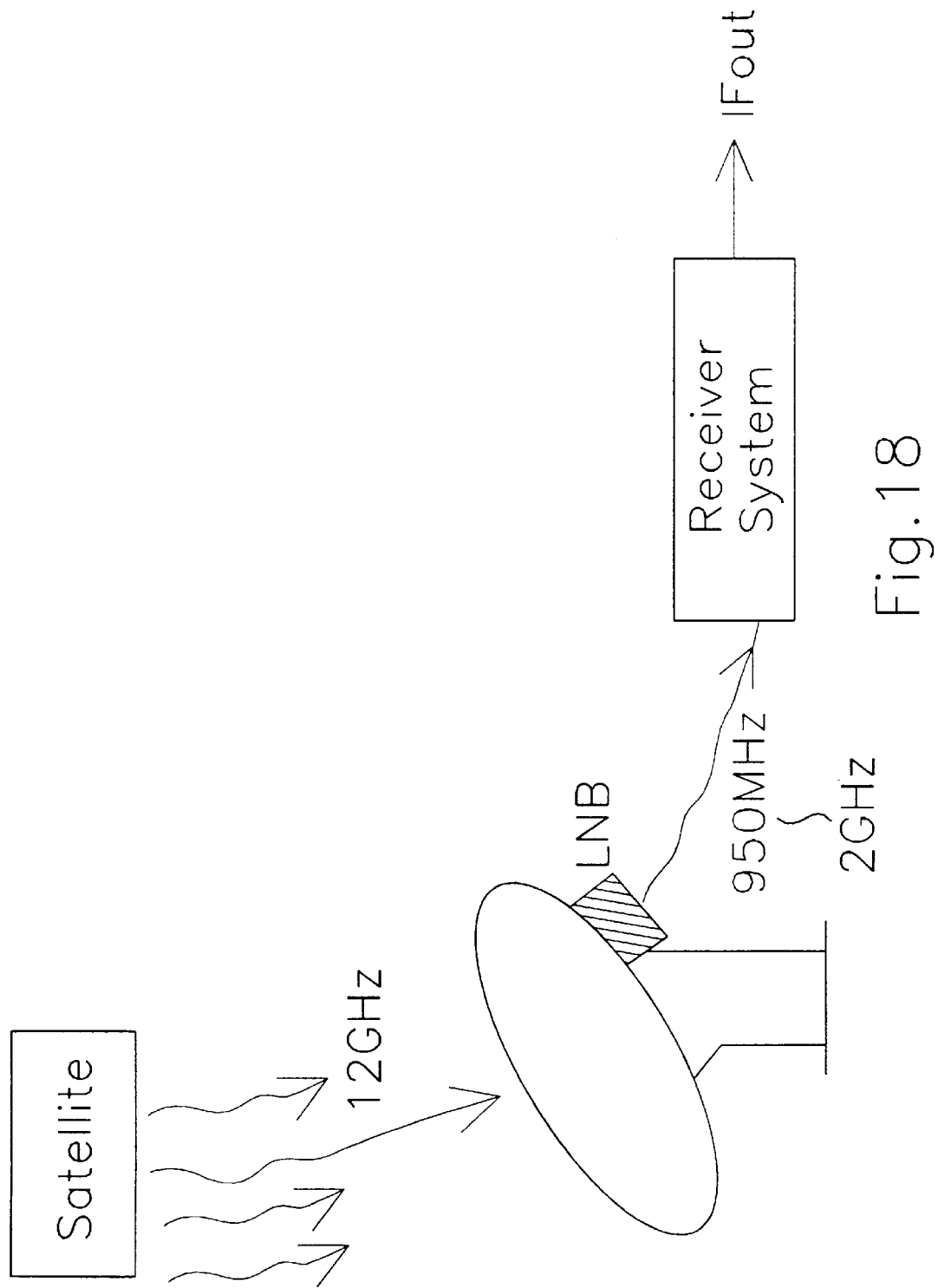
FIG. 18 schematically shows how a receiver system of the invention can be incorporated in a direct broadcast satellite TV system.

Based on the above descriptions, the receiver system in accordance with the preferred embodiments of the invention is capable of performing superbly with low noise and low intermodulation characteristics within the broad frequency range. The electronic circuitry of the receiver system of the invention is also suitable for fabrication into IC devices. Specifically, the circuitry enclosed within the dotted line in the embodiment of FIGS. 4A and 4B can be implemented as a single monolithic RF IC device. Therefore, the implementation of a receiver system utilizing the circuitry embodiment of the invention can be achieved with minimum possible number of external components. FIG. 17 is a block diagram that shows how the receiver system of the invention can be combined with a handful of other components to build a cable/broadcast TV tuner. The block diagram of FIG. 17 represents a simple hardware that can be implemented as miniature receiver for portable applications. Moreover, FIG. 18 schematically shows how a receiver system of the invention can be incorporated in a direct broadcast satellite TV system. Since the receiver system in accordance with the teachings of the invention is capable of operating up to the frequency of above 3 GHz, therefore, the satellite microwave signal with a frequency in the range of 950 MHz to 2 GHz directly intercepted from the satellite dish-antenna, after being processed in the first stage of low-noise amplifier and the first frequency-down circuitry in low noise box (LNB). Further, since the receiver system of the invention employs the single-conversion scheme for its frequency processing, therefore, those expensive high-frequency filters and the circuit components for the second conversion for those double-conversion system can be eliminated. This simplifies circuit design and reduces costs.

While the invention has been described by way of example and in terms of preferred embodiments, it is to be understood that the invention need not be limited to the disclosed embodiments. It is intended to cover various modifications and similar arrangements included within the spirit and scope of the appended claims, the scope of which should be accorded the broadest interpretation so as to encompass all such modifications and similar structures.

We claim:

1. A low-noise low-intermodulation broadband receiver comprising:

a low-noise amplifier, receiving an input differential or single-ended radio frequency signal for amplification, having low noise figure, low distortion, input impedance matching, and differential output signal;

a first buffer, receiving the output of the low-noise amplifier, adjusting DC biasing, generating buffered signal and preventing reverse signal flow;

a first voltage/current converter, receiving the first buffered output signal, and linearly converting the voltage signal into a current signal;

an automatic gain control amplifier, receiving the current signal generated by the first voltage/current converter and converting into voltage signal for output, and adjusting the amplification gain based on the gain control signal input by an intermediate frequency output amplitude sensor, for maintaining the output thereof at a designated amplitude level;

a second buffer, receiving the output signal of the automatic gain control amplifier, adjusting DC biasing, generating buffered signal and preventing reverse signal flow;

a tracking filter, receiving the output signal of the second buffer and allowing passage therefrom only the component of the radio frequency signal with designated frequency and filtering out all other signal components;

a second voltage/current converter, receiving the radio frequency signal output by the tracking filter and having designated frequency, and converting the voltage signal into a current signal;

a phase-locked loop comprising a voltage-controlled oscillator core, a resonator, a third buffer and a phase-locked loop controller, wherein the resonator receiving the control signal of the phase-locked loop to determine an oscillation frequency, the voltage-controlled oscillator core being connected to the resonator for generating an oscillation signal having the oscillation frequency, and the oscillation signal being buffered by the third buffer and input to the phase-locked loop controller, the third buffer receiving the output signal of the voltage-controlled oscillator core, adjusting DC biasing, generating buffered signal and preventing reverse signal flow, and the phase-locked loop controller receiving channel data and generating band switching signal and frequency fine-tuning signal for the phase-locked loop circuitry and the tracking filter;

a mixer, receiving the signal of the second voltage/current converter and the signal of the third buffer for generating the mixed signal of the two signals;

a fourth buffer, receiving the output signal of the mixer, adjusting DC is biasing, generating buffered signal and preventing reverse signal flow;

an intermediate frequency filter, receiving the output of the fourth buffer for generating a final intermediate frequency signal for subsequent signal demodulation;

wherein the noise figure of the low-noise amplifier determines the low noise figure performance of the receiver apparatus, and the linearity of the low-noise amplifier, the first buffer, the first voltage/current converter and the automatic gain control amplifier maintains the good linearity performance of the receiver and the amplitude of the output of the automatic gain control amplifier at a designated level.

2. The receiver apparatus of claim 1, further comprising a pre-selection filter for filtering the radio frequency input signal before input to the low-noise amplifier, the pre-selection filter pre-selects the signal component of the radio frequency input signal with desired frequency and further matching input impedance.

3. The receiver apparatus of claim 1, wherein the low-noise amplifier comprises:

a first transistor and a second transistor connected in a differential pair, the sources of the first and second transistors being tied together and connected to a current source, and gates of the first and second transistors receiving the radio frequency input signal;

a first output resistor and a second output resistor, the first output resistor being connected between the power potential of the apparatus and the drain of the first transistor, and the second output resistor being connected between the power potential of the apparatus and the drain of the second transistor; and a first negative feedback element and a second negative feedback element, the first negative feedback element being connected between the drain and the gate of the first transistor, and the second negative feedback element being connected between the drain and the gate of the second transistor.

4. The receiver apparatus of claim 1, wherein the low-noise amplifier comprises:

a first transistor and a second transistor connected in a differential pair, the sources of the first and second transistors being tied together and connected to a current source, and gates of the first and second transistors receiving the radio frequency input signal;

a third transistor and a fourth transistor connected in a differential pair, the source of the third transistor being connected to the drain of the first transistor, and the source of the fourth transistor being connected to the drain of the second transistor, and bias potential being applied to the gates of the third and fourth transistors;

a first output resistor and a second output resistor, the first output resistor being connected between the power potential of the apparatus and the drain of the third transistor, and the second output resistor being connected between the power potential of the apparatus and the drain of the fourth transistor; and a first negative feedback element and a second negative feedback element, the first negative feedback element being connected between the drain of the third transistor and the gate of the first transistor, and the second negative feedback element being connected between the drain of the fourth transistor and the gate of the second transistor.

5. The receiver apparatus of claim 1, wherein the voltage-controlled oscillator core comprises:

a first transistor and a second transistor connected in a differential pair, the sources of the first and second transistors being tied together and connected to a current source, and gates of the first and second transistors being connected to the ground potential of the apparatus via a corresponding first and second capacitor, the drain of the first transistor being connected to the gate of the second transistor across a third capacitor, and the drain of the second transistor being connected to the gate of the first transistor across a fourth capacitor; and a first load resistor and a second load resistor, the first load resistor being connected between the drain of the first transistor and the power potential of the apparatus, and the second load resistor being connected between the drain of the second transistor and the power potential of the apparatus; wherein the voltage-controlled oscillator core initiating a stable oscillation when the gain thereof reaches unity and the phase shift thereof reaches 360 degrees.

6. The receiver apparatus of claim 1, wherein the voltage-controlled oscillator core comprises:

a first transistor and a second transistor connected in a differential pair, the sources of the first and second transistors being tied together and connected to a current source, and gates of the first and second transistors being connected to the ground potential of the apparatus via a corresponding first and second capacitor, a third transistor and a fourth transistor connected in a differential pair, the source of the third transistor being connected to the drain of the first transistor, the source of the fourth transistor being connected to the drain of the second transistor, the drain of the third transistor being connected to the gate of the second transistor across a third capacitor, and the drain of the fourth transistor being connected to the gate of the first transistor across a fourth capacitor; and a first load resistor and a second load resistor, the first load resistor being connected between the drain of the third transistor and the power potential of the apparatus, and the second load resistor being connected between the drain of the fourth transistor and the power potential of the apparatus; wherein the voltage-controlled oscillator core initiating a stable oscillation when the gain thereof reaches unity and the phase shift thereof reaches 360 degrees.

7. The receiver apparatus of claim 5, wherein the resonator comprises:

a first DC blocking capacitor and a second DC blocking capacitor having the first end thereof connected to the drains of the first and second transistors of the voltage-controlled oscillator core for blocking DC signal;

a first and second resistor having the first end thereof connected to ground potential of the apparatus and the second end thereof connected to the second end of the corresponding first and second DC blocking capacitors for providing the DC signal paths;

a varactor having first end thereof connected to the second end of the first DC blocking resistor;

a third DC blocking capacitor connected between the second end of the varactor and the second end of the second DC blocking resistor;

an input resistor having the first end thereof receiving a frequency fine-tuning control signal output by the phase-locked loop controller, and the second end thereof connected to the second end of the varactor, the frequency fine-tuning control signal generating reverse bias to the varactor to cause the varactor exhibiting appropriate capacitance;

a first inductor pair and a first switching diode pair, the first end of the first inductor pair being connected to the second end of the first and second DC blocking capacitors respectively, the negative terminal of first diode pair being connected to the second end of the first inductor pair respectively, and the positive terminal of the first diode pair being connected to a first band switching control signal and the first ground-connecting capacitor respectively;

a second inductor pair and a second switching diode pair, the first end of the second inductor pair being connected to the second end of the first inductor pair respectively, the negative terminal of second diode pair being connected to the second end of the first inductor pair respectively, and the positive terminal of the first diode pair being connected to a second band switching control signal and the second ground-connecting capacitor respectively;

a third inductor pair having the first end thereof connected to the second end of the second inductor pair respectively, and the second end of the third inductor pair being connected to ground potential respectively;

wherein the apparatus generating an output signal in one of three different frequency bands including a first frequency band when the first band switching control signal has a high status and the second band switching control signal has a high status, a second frequency band when the first band switching control signal has a low status and the second band switching control signal has a high status, and a third frequency band when the first band switching control signal has a low status and the second band switching control signal has a low status.

8. The receiver apparatus of claim 6, wherein the resonator comprises:

a first DC blocking capacitor and a second DC blocking capacitor having the first end thereof connected to the drains of the third and fourth transistors of the voltage-controlled oscillator core for blocking DC signal;

a first and second resistor having the first end thereof connected to ground potential of the apparatus and the second end thereof connected to the second end of the corresponding first and second DC blocking capacitors for providing the DC signal paths;

a varactor having first end thereof connected to the second end of the first DC blocking resistor;

a third DC blocking capacitor connected between the second end of the varactor and the second end of the second DC blocking resistor;

an input resistor having the first end thereof receiving a frequency fine-tuning control signal output by the phase-locked loop controller, and the second end thereof connected to the second end of the varactor, the frequency fine-tuning control signal generating reverse bias to the varactor to cause the varactor exhibiting appropriate capacitance;

a first inductor pair and a first switching diode pair, the first end of the first inductor pair being connected to the second end of the first and second DC blocking capacitors respectively, the negative terminal of first diode pair being connected to the second end of the first inductor pair respectively, and the positive terminal of the first diode pair being connected to a first band switching control signal and the first ground-connecting capacitor respectively;

a second inductor pair and a second switching diode pair, the first end of the second inductor pair being connected to the second end of the first inductor pair respectively, the negative terminal of second diode pair being connected to the second end of the first inductor pair respectively, and the positive terminal of the first diode pair being connected to a second band switching control signal and the second ground-connecting capacitor respectively;

a third inductor pair having the first end thereof connected to the second end of the second inductor pair respectively, and the second end of the third inductor pair being connected to ground potential respectively;

wherein the apparatus generating an output signal in one of three different frequency bands including a first frequency band when the first band switching control signal has a high status and the second band switching control signal has a high status, a second frequency band when the first band switching control signal has a low status and the second band switching control signal has a high status, and a third frequency band when the first band switching control signal has a low status and the second band switching control signal has a low status.

9. The receiver apparatus of claim 1, wherein the tracking filter comprises a single or a plurality of band-pass filters connected in parallel, and wherein the first and second band switching control signals determining the activation of each of the plurality of band-pass filters for generating the desired band-pass filtering.

10. The receiver apparatus of claim 2, wherein the tracking filter comprises a single or a plurality of band-pass filters connected in parallel, and wherein the first and second band switching control signals determining the activation of each of the plurality of band-pass filters for generating the desired band-pass filtering.

11. The receiver apparatus of claim 2, wherein the preselection filter comprises a single or a plurality of band-pass filters connected in parallel, and wherein the first and second band switching control signals determining the activation of each of the plurality of band-pass filters for generating the desired band-pass filtering.

* * * * *